(12) United States Patent
Risbo et al.

(10) Patent No.: US 8,144,043 B2
(45) Date of Patent: Mar. 27, 2012

(54) SHAPING INTER-SYMBOL-INTERFERENCE IN SIGMA DELTA CONVERTER

(75) Inventors: Lars Risbo, Hvaiso (DK); Rahmi Hezar, Plano, TX (US); Burak Kelleci, Plano, TX (US); Anker Bjoern-Josefsen, Lynge (DK)

(73) Assignee: Texas Instruments Incorporated, Dallas, TX (US)

( * ) Notice: Subject to any disclaimer, the term of this patent is extended or adjusted under 35 U.S.C. 154(b) by 96 days.

(21) Appl. No.: 12/769,629

(22) Filed: Apr. 28, 2010

(65) Prior Publication Data

US 2011/0267210 A1 Nov. 3, 2011

(51) Int. Cl.
*H03M 1/66* (2006.01)
(52) U.S. Cl. .......................... 341/144; 341/143; 341/152
(58) Field of Classification Search .................. 341/144, 341/152, 143
See application file for complete search history.

(56) References Cited

U.S. PATENT DOCUMENTS

| 7,215,271 | B2 | 5/2007 | Ido et al. |
| 7,307,567 | B2 | 12/2007 | Kuttner |
| 2005/0052304 | A1* | 3/2005 | Trotter et al. ................. 341/152 |

OTHER PUBLICATIONS

T. Shui, R. Schreier, and F. Hudson, "Mismatch Shaping for a Current-Mode Multibit Delta-Sigma DAC", IEEE Journal of Solid-State Circuits, vol. 34, No. 3, Mar. 1999.
"The Data Conversion Handbook" edited by Walt Kester, Chapter 3: Data Converter Architectures, "Analog-Digital Conversion", pp. 3.1-3.140 (1-142), Newnes, 2005.

* cited by examiner

*Primary Examiner* — Jean B Jeanglaude
(74) *Attorney, Agent, or Firm* — John R. Pessetto; W. James Brady; Frederick J. Telecky, Jr.

(57) ABSTRACT

A signal converting system is described that has a multi-segment digital to analog converter coupled to one or more error shaping loops. Each error shaping loop includes a quantizer with a feedback loop configured to generate a control signal responsive to a stream of symbols and to an error signal. Each error shaping loop also includes an inter-symbol-interference (ISI) shaping loop coupled to receive the control signal and to produce an ISI portion of the error signal that is responsive to inter-symbol transition rate.

20 Claims, 16 Drawing Sheets

SHAPING INTER-SYMBOL-INTERFERENCE IN SIGMA DELTA CONVERTER

FIELD OF THE INVENTION

This invention generally relates to signal converters and more particularly to sigma delta based signal converters.

BACKGROUND OF THE INVENTION

Digital to analog converters (DAC) are used to convert a digital representation of a signal into an analog representation of the same signal. DACs are used in a wide variety of applications, ranging from medical and entertainment to communications (both voice and data). Digital to analog converters are electrical circuit devices that convert a digital signal that is a series of multi-bit samples, or numbers, in the digital domain to a continuous signal, such as a voltage or current, in the analog domain. A variety of DAC converter types exist, including a thermometer DAC, R-2R ladder network DAC, segmented DAC, oversampling/interpolating DAC, and pulse-width modulated DAC, for example. Another type is known as a sigma delta or delta sigma ($\Delta\Sigma$) D/A converter. It consists of an "interpolation filter" that is a digital circuit which accepts data at a low rate, inserts zeros at a high rate, and then applies a digital filter algorithm and outputs data at a high rate, a $\Sigma\Delta$ modulator that effectively acts as a low pass filter to the signal but as a high pass filter to the quantization noise, and converts the resulting data to a high speed bit stream, and a 1-bit DAC whose output switches between equal positive and negative reference voltages. The output is filtered in an external analog low pass filter (LPF). It is also possible to use more than one bit in the $\Sigma\Delta$ DAC. The general operation of the various types of DACs are well known and described in the literature, for example "The Data Conversion Handbook," James Bryant, Walt Kester (2005), Chapter 3, which is incorporated by reference herein.

The oversampling in a sigma delta DAC is commonly performed at a multiple of the Nyquist rate ($F_N$) for a given input signal frequency and typically the sampling frequency $F_S$ is 10 to 1000 times $F_N$. In this manner, quantization noise power is spread over a bandwidth equal to the sampling frequency, thereby reducing the noise density in the band of interest. Sigma-delta DACs are commonly used in applications where high resolution with low to moderate conversion rates are required. An advantage of sigma-delta DACs is that the sigma-delta DACs normally make use of single or low multi-bit (typically two, three, four or six bit) quantizer, making the precision requirements of the sigma-delta DAC much lower than other types of DACs that may use quantizers with a large number of bits. However, sigma-delta DACs having a larger number of elements, such as 32 or 64 elements, are now becoming more common. Operating at a frequency greater than the required frequency is commonly referred to as oversampling and a DAC that is operating at a frequency that is K times greater than the required frequency is referred to as a K-times oversampling DAC.

Non-linearity may be a problem when using a sigma delta signal converter. There are two major sources of non-linearity: static and dynamic. FIG. 1 is a block diagram of a prior art digital to analog converter 100 illustrating an upsampling module, a sigma delta module (SDM), static mismatch shaping module 102 and six unit weight DAC segments 104, whose summed output is then fed through a low pass filter module. Mismatch shaping modules are typically referred to as Dynamic Element Matching (DEM) or Data Weighted Average (DEM) modules.

FIG. 2 is a more detailed block diagram of prior art mismatch shaping module 102 that is used in the signal converter of FIG. 1. The SDM updates every sample with the number of segments to use N(k) in the range 0 . . . M. Mismatch shaper 102 is a vectorized sigma-delta loop that includes a vector quantizer 208 and M loop filters 206. The loop filters integrate the usage history of each of the M segments. The vector quantizer looks at the loop filter output plus dither signal vector $\underline{e}(k)$ and picks the N vector indices with highest values. The output segment control vector $\underline{s}(k)$ is formed so that $s_i(k)=1$ for all the picked indices i and zero otherwise.

Each segment 104 is thus controlled by its own 1-bit sigma-delta modulator that will replicate the SDM signal plus a high-pass shaped quantization error. The high-pass shaping reduces the sensitivity to element mismatch which causes non-uniform weighting. The vector quantizer needs to implement a sorting of M elements and there are numerous sorting algorithms. The simpler algorithms have $O(M^2)$ complexity which will give gate counts that scale with M2. The theoretically best algorithms have O(MlogM) complexity.

All M elements need to be used by the same frequency on average—this eliminates the DC error due to mismatches. Moreover, the mismatch shaper should force each element to toggle in patterns that concentrates the AC mismatch error at high frequencies and reduces the audio band errors Mismatch shaping does not address dynamic errors, however. Several schemes for addressing dynamic errors have been used. For example, the DEM may be operated at half the clock rate, as described in Ido et al, U.S. Pat. No. 7,215,271 B2. In this case, the number of transitions will be restricted and dynamic error power is reduced to 4.6·Δ2→ better than R2DWA. However, this scheme compromises the static mismatch algorithm and Noise due to static mismatch will increase.

In another solution the sampling clock frequency is cut by half, which reduces the dynamic error by 6 dB. However, out-of band noise moves into the band and therefore requires the order of the SDM be increased to compensate. Higher order modulators are more unstable and have limited stable input range.

Another solution is to limit the operation of the vector quantizer, as described by R. Schreier, Mismatch Shaping for a Current-Mode Multibit Delta-Sigma DAC, IEEE JOURNAL OF SOLID-STATE CIRCUITS, VOL. 34, NO. 3, MARCH 1999. The vector quantizer makes decisions such that switching rate can get only restricted values. For example, for 8-level DAC only 3,4,5 elements can switch at a time. This method also compromises static mismatch shaping.

Mobile audio devices are a ubiquitous fixture of modern society. Cellular telephones, personal music players, portable gaming systems, etc. are constant companions for many people. Music players and gaming systems may make use of $\Sigma\Delta$ DACs to produce the audio signal(s) that are then reproduced by a speaker. Cell phones continue to increase in computer processing capability and sophistication. The basic radio transceiver within the cell phone may make use of a sigma-delta DAC for signal modulation and transmission. The increased memory capacity and computing resources on a cell phone support the installation of various applications, often referred to as "apps" that allow a diverse range of functions to be performed by the cell phone when not being used for conversation. Digital to analog conversion of audio signals to drive speakers/headsets is required by several apps that run on a mobile device and may be performed by a sigma-delta DAC.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
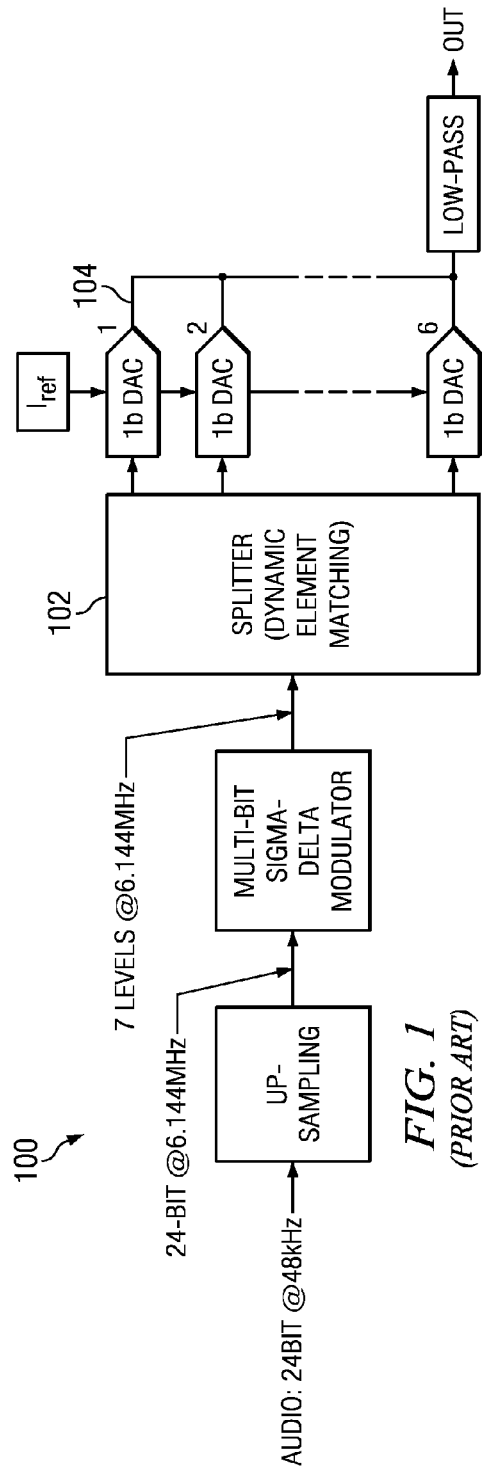
FIG. 1 is a prior art digital to analog converter with mismatch shaping.

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Sigma delta signal converters are used in a large number of applications. However, non-linearity may be a problem when using a sigma delta signal converter. There are two major sources of non-linearity: static and dynamic. As discussed above, many schemes exist for mitigating static error, such as a mismatch shaping loop with a vector quantizer, rotation using a simple barrel shifter, a Galton tree, etc. However, dynamic error is often overlooked in design, since simulation tools don't model rise and fall times. In order to simulate dynamic errors, circuit extraction may be used to improve simulation to show it. An analog to digital converter (ADC) has the same problem as a DAC since an ADC has a feedback DAC that may exhibit the same dynamic problem.

In order to mitigate dynamic errors, more work could be performed on layout of analog devices to get better matches between the unit elements, but this is expensive in power and area. Previously known schemes all trade off static error power, quantization noise, and stability for dynamic error power. None can come close to a 20-bit performance level. A new scheme for mitigating dynamic errors will now be described that is mostly digital signal processing, and therefore less expensive than analog solutions. Since this scheme is mostly digital, it enables scaling of DAC operation to provide more economical high resolution DACs and ADCs. DACs and ADCs having thirty-two or more bits of precision may be economically implemented using the dynamic error correction scheme and exemplary embodiments descried in more detail below.

Figure 3:
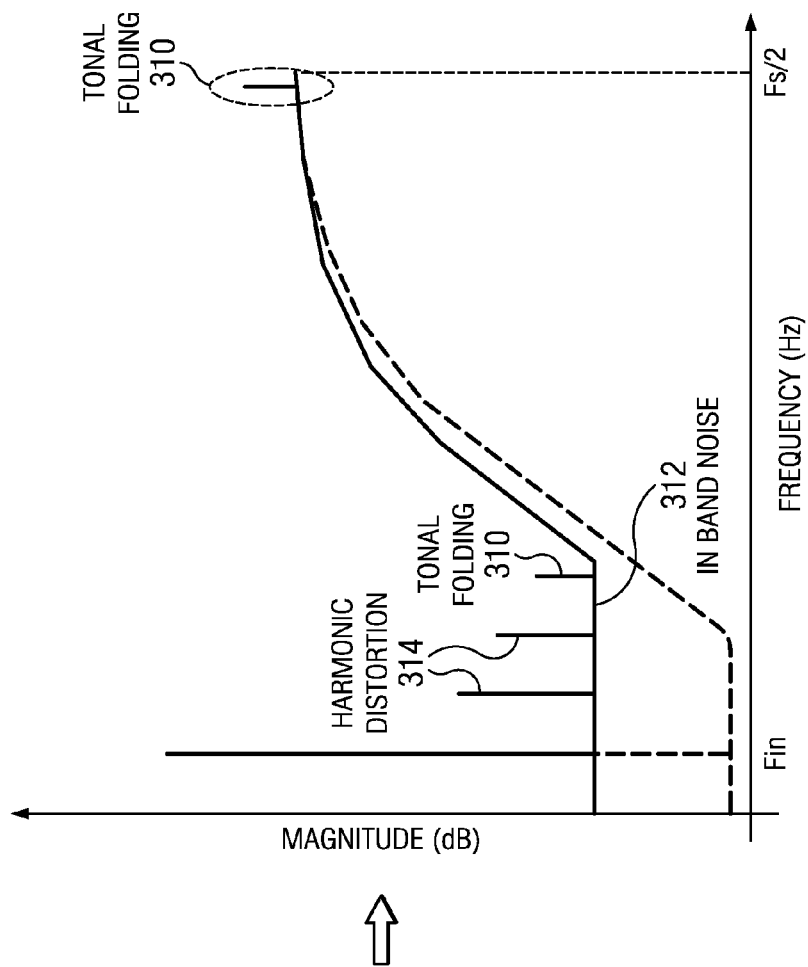
FIG. 3 is a plot illustrating types of non-linearity in the output of a signal converter.
Figure 3:
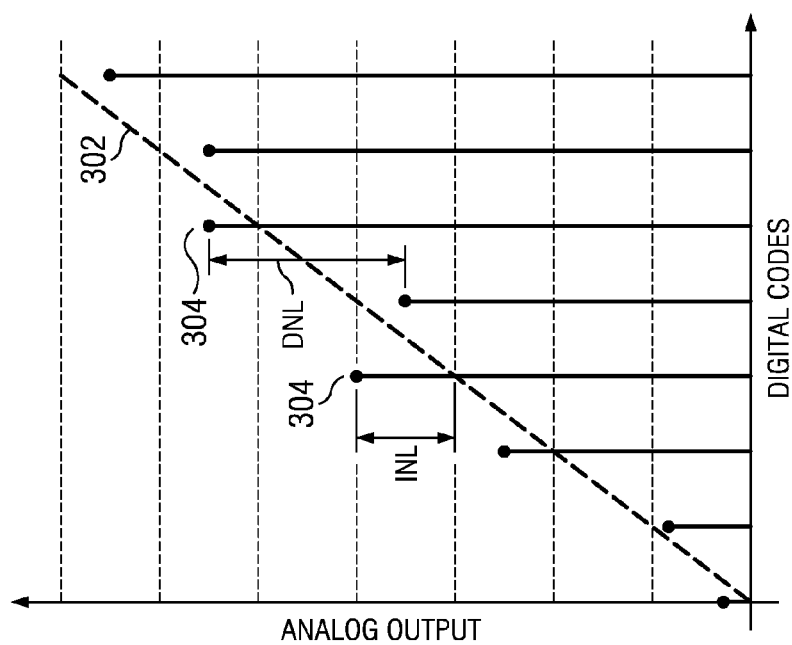

FIG. 3 is a plot illustrating types of non-linearity that may occur in the output of a signal converter. After offset and gain errors are removed, Integral non-linearity (INL) is the deviation of the actual measured output 304 from a straight line 302, which is the ideal DAC output. Straight line 302 can conservatively be drawn from the end points of the converter's transfer response. An alternative is to find the best-fit straight line such that the maximum difference (MSE) is minimized.

Differential non-linearity (DNL) is a measure of the worst case deviation from the ideal one least significant bit (LSB) step. This is a measure of the uniformity of LSB sizes between DAC codes. For example, a DAC with a 1.5 LSB output change for a one LSB digital code change exhibits ½ LSB differential non-linearity Since each unit element segment may have slight geometry and doping variations, variations in the output current from each element typically are present. These variations are referred to as static element mismatch and cause INL errors in the DAC transfer function, which is a straight line in the ideal case. Because the input to a typical audio DAC is noise shaped, the out of band noise 310 folds in and increases noise floor 312 due to this nonlinearity. In addition, the signal's harmonics 314 will be visible in the spectrum.

Figure 4:
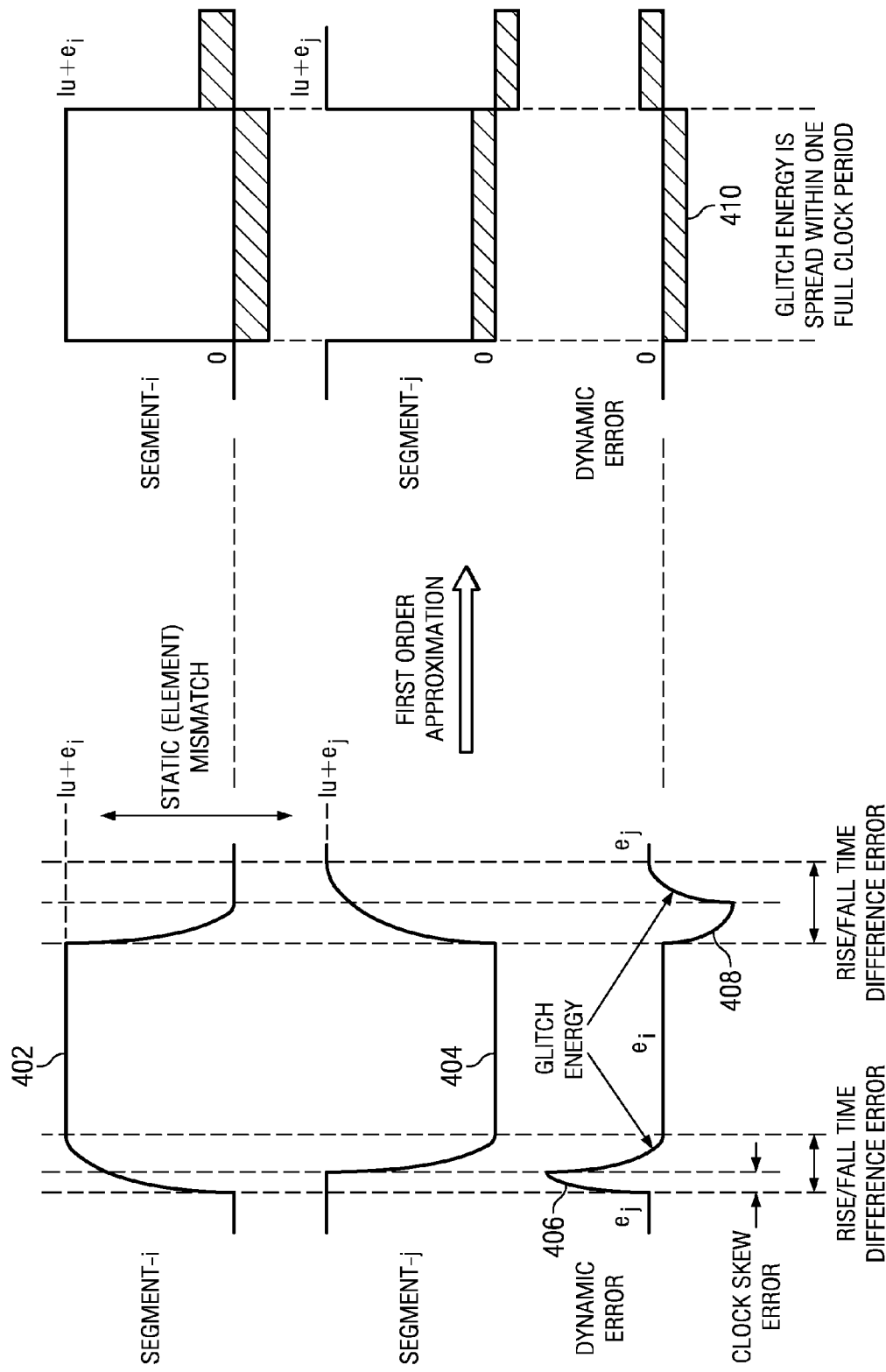
FIG. 4 is a plot illustrating cause and effect of dynamic errors in a DAC.

FIG. 4 is a plot illustrating cause and effect of dynamic errors in a DAC. FIG. 4 illustrates an exemplary segment-i turning on (402) and an exemplary segment-j turning off (404). Dynamic errors (406, 408) are generated because of one or more of the following effects: difference in different rise and fall times, a clock skew distribution; a memory effect (parasitic capacitance) at the switching nodes; a parasitic coupling between switching nodes between DAC elements. These dynamic mismatches will lead to "switching activity dependent" distortion and noise because the glitch energy is spread within one full clock period, as illustrated at 410.

The switching activity of a DAC depends on the input signal amplitude and frequency and on the static mismatch shaping algorithm. As mentioned earlier, there are several known static mismatch shaping algorithms. Higher order shaping methods are very robust and can handle even severe static mismatch. For example, for 1% (3 sigma) static mismatch only $1^{st}$ order shaping does a pretty decent job. First order shaping may be done with a simple rotation implemented with a barrel shifter, for example. $2^{nd}$ order shaping is inherently linear due to less idle tones beating into mismatch. However, as also mentioned above, there has not been a robust, economical method for handling dynamic errors.

Equation (1) explains DAC mismatch errors in a more rigorous manner.

$$DACe_{[n]} = \underbrace{\sum_{i=1}^{N} \varepsilon_i S_{i[n]}}_{\text{Static Element Mismatch Errors}} - \underbrace{\sum_{i=1}^{N} \delta_{r,i}[S_{i[n]} \cdot (1 - S_{i[n-1]})]}_{\text{Dynamic Rise Time Errors}} + \underbrace{\sum_{i=1}^{N} \delta_{f,i}[(1 - S_{i[n]}) \cdot S_{i[n-1]}]}_{\text{Dynamic Fall Time Errors}} \quad (1)$$

$\varepsilon_i$ is the static element mismatch that may be treated with DWA (data weighted averaging) and R2DWA (restricted search, second order DWA, return to zero) algorithms, for example. $\delta_{r,i}$ is the rise time error for DAC segment i and contributes as negative energy. $\delta_{f,i}$ is the fall time error for DAC segment i and contributes as positive energy. $S_{i[n]}$ is the 1-bit (0 or 1) control signal to DAC segment i at time n.

Rise and fall time energy is referred to the sampling clock period, as illustrated at 410 in FIG. 4. Rise and fill time errors are budgeted to include clock skew distribution. Clearly, contribution of rise and fall time errors will depend on the segment switching activity. Overall, more switching activity leads to more glitch energy, more distortion and more noise.

Multiplication of present and past signal term, i.e. S[n]×S[n−1] is referred as Inter-Symbol-Interference, i.e. ISI. From now on in this disclosure, this term will be used to define dynamic errors. ISI is derived from communication theory where the information is sent as a stream of symbols. The ISI then describes the leakage of one symbol into the next which can cause detection errors when reading the present symbol. For a DAC, the ISI means in general that the present symbol (e.g. DAC voltage within a sampling interval) depends on the previous symbols. i.e., the rise/fall mismatch is a special case when the symbols are modulated in a two symbol (hi/lo) alphabet. For multi-symbol modulation the ISI can be more complicated and cannot be described by the product stated above. The dependency can also go back multiple symbols, but this effect is much weaker since most errors die out rapidly. For 1-bit (hi/lo) modulation, the product stated above represents the dominant effect.

Multiplication in the time domain means convolution in the frequency domain, such that ISI is also expressed as $S(z) * z^{-1}S(z)$. This operation will cause even order harmonic distortion and increased noise floor due to out of band quantization noise folding into the signal band.

Figure 5A:
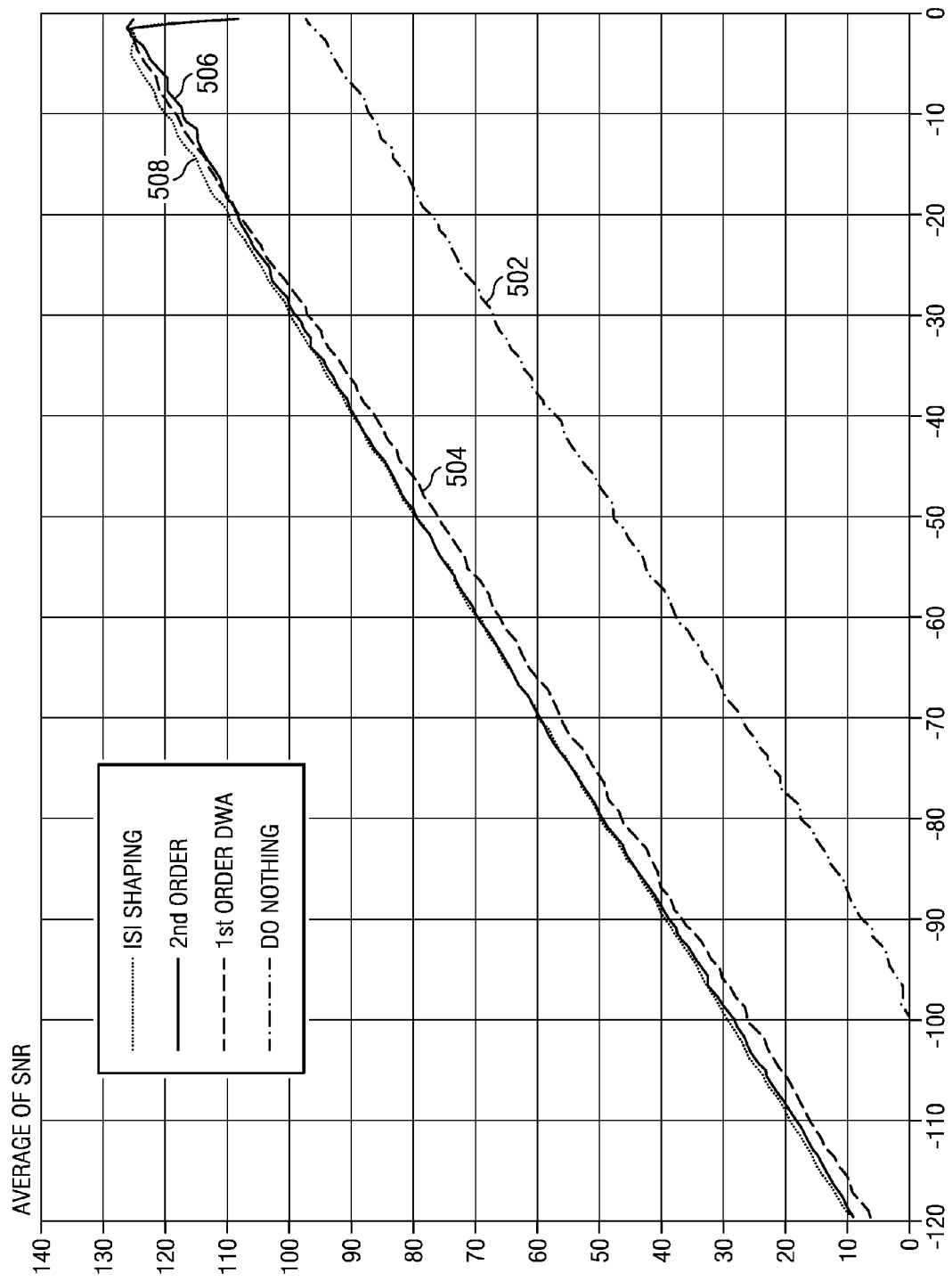
FIGS. 5A and 5B are plots of SNR and THD under various correction scenarios.
Figure 5B:
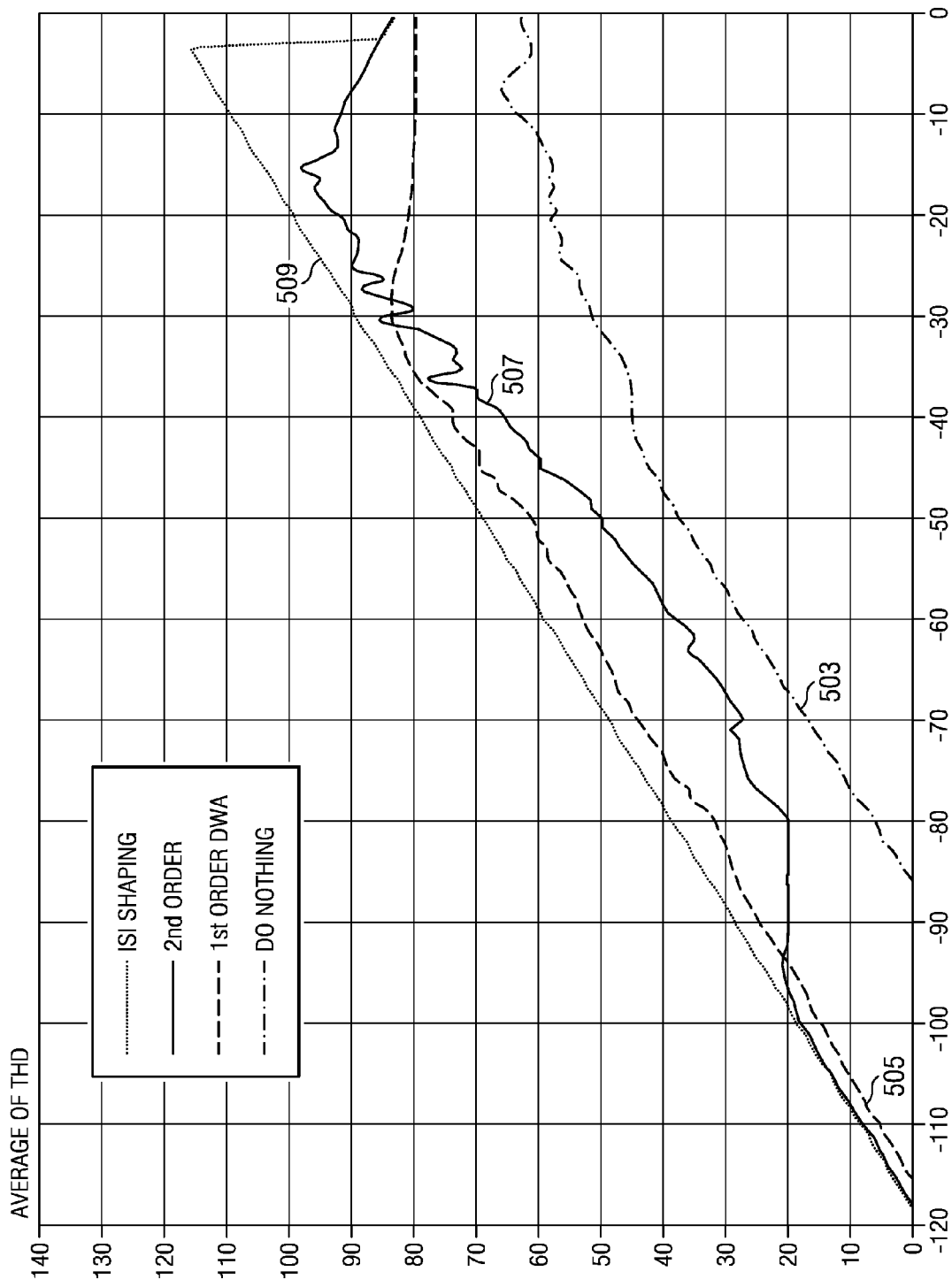

Therefore, the results of static match error correction algorithms suffer under dynamic mismatch conditions. FIGS. 5A and 5B are plots of SNR and THD, respectively, under various correction scenarios in the presence of dynamic errors. These figures illustrate the beneficial result of ISI shaping that will be described in more detail below. Both signal to noise ratio (SNR) and total harmonic distortion (THD) suffer due to static mismatch and ISI error when no correction is performed, as indicated by plot lines 502, 503. There is significant tonal behavior due to glitch energy. Simple $1^{st}$ order DWA (barrel shifter), (plots 504, 505) suffers significant loss and is the most non-linear, as indicated by plot 504. This is because it has the most signal dependent switching activity. $2^{nd}$ order shaping, plots 506, 507, has somewhat reduced switching activity and better linearity, as indicated by plot 506. Both scenarios suffer from significant tonal behavior, as indicated by plots 505, 507.

As illustrated by plots 508, 509, adding ISI shaping provides impressive linearity compared to all other methods. In this case, essentially all of the dynamic errors resulting from switching activity are pushed outside the audio band.

Figure 6:
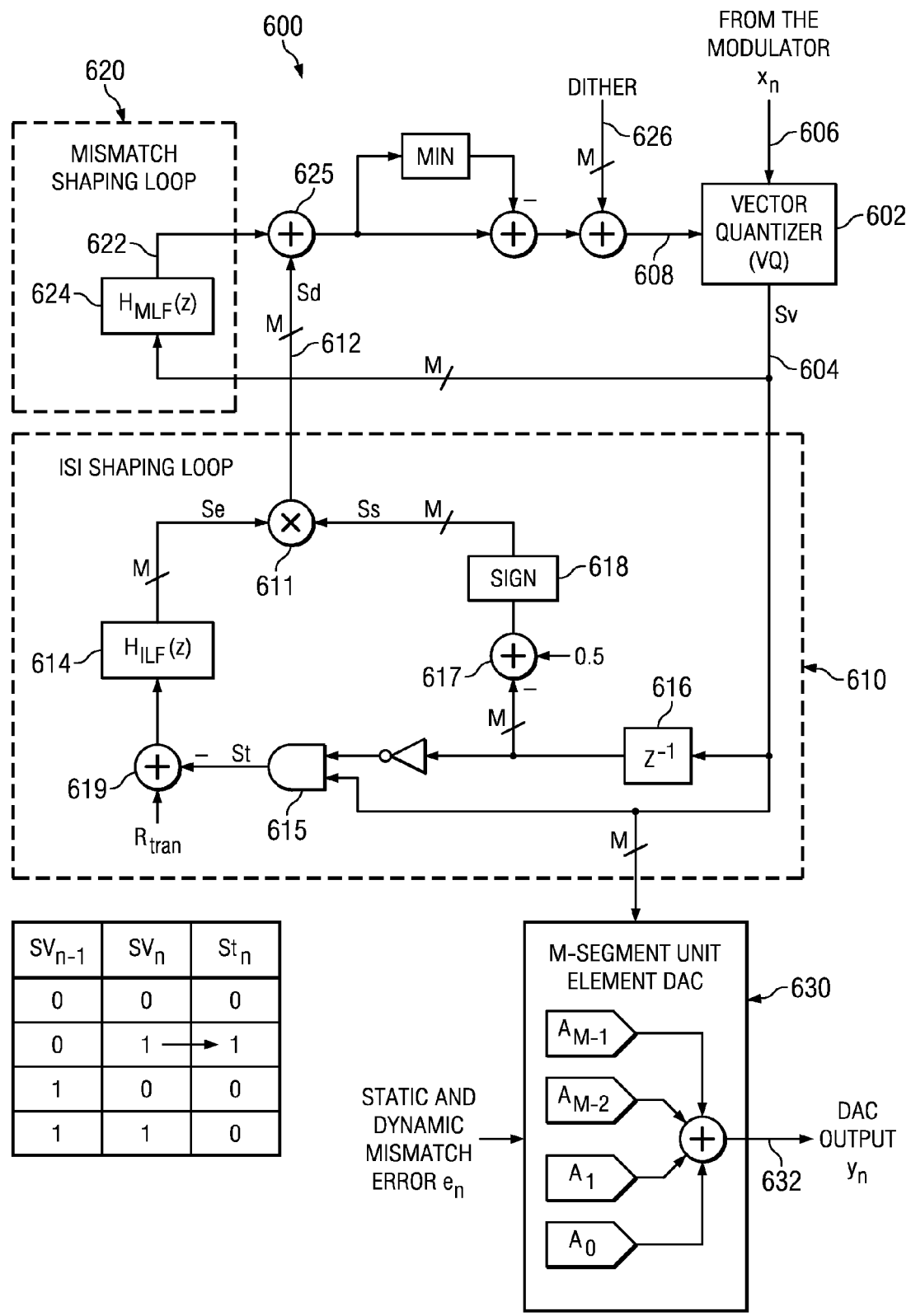
FIG. 6 is a block diagram of an embodiment of a signal converter that uses an inter-symbol interference shaping loop to mitigate dynamic error.

FIG. 6 is a block diagram of an exemplary embodiment of a signal converter that uses an inter-symbol interference shaping loop to mitigate dynamic error. This embodiment of the invention includes a quantizer 602 with a feedback loop configured to generate a control signal 604 responsive to a stream of symbols 606 and to an error signal 608, and an inter-symbol-interference (ISI) shaping loop 610 coupled to receive the control signal 604 and to produce an ISI portion 612 of the error signal that is responsive to inter-symbol transition rate. Control signal 604 is coupled to multi-segment DAC 630 that produces output signal 632 by summing the outputs of each of the multiple segments that is an analog representation of the stream of digital symbols 606.

In this embodiment, the stream of symbols 606 is a sigma delta modulated (SDM) signal, control signal 604 is a vectorized control signal, and error signal 608 is a vectorized error signal. As used herein, the term "vectorized' simply indicates that the signal is a multi-value signal having M values to coincide with the M unit segments and corresponding M parallel feedback loops. Vector quantizer (VQ) 602 is configured to generate the control vector responsive to the SDM signal and to the vectorized error signal using any one of several known mismatch shaping schemes as discussed above. In general, the VQ 602 is implemented to perform a sort of element usage and then a selection of the next set of elements to be turned on/off for each clock cycle. The control vector is operable to turn each of the M unit segments 630 on and off in a manner that the sum of turned on elements approximately represents the SDM signal.

The feedback loop is a vectorized mismatch shaping loop 620 coupled to receive the control vector and to produce a portion 622 of the vectorized error signal by filtering usage history of each of the M segments to normalize the frequency of usage and spectrally shape each segment signal. The filtering operation is performed in filter module 624. This may be a second order or higher filter, depending on the order of high pass mismatch loop filter (Hmlf). The mismatch shaping loop keeps track of which elements are used and tries to select least used elements, based on history, in order to provide static mismatch shaping. A dither signal 626 may be added to the error signal to further improve static mismatch shaping.

ISI loop 610 is a vectorized inter-symbol-interference shaping loop coupled to receive control vector 604 and to produce ISI portion 612 of the vectorized error signal 612 that is responsive to inter-symbol interference. Therefore, there are M ISI loops all acting in parallel. In various embodiments of the invention there may be 32-64 elements, or larger, for example.

Each ISI shaping loop 610 looks at transition history of a respective unit element by looking at its past level and current level value. An edge transition detector is coupled to an ISI loop filter 614 that is operable to detect transitions in a respective bit of the control vector. The edge detector in this embodiment is AND gate 615 and register 616. AND gate 615 produces a logic 1 whenever there is a low to high transition of the respective bit of control vector 604 such that the current value is 1, and when the past value stored in register 616 is logic 0, as illustrated in the state table in FIG. 6

The ISI error contains a linear and a nonlinear part. If rise/fall times match exactly the error is symmetrical and behaves like a linear processing (filter) which does not produce noise or distortion. However, if the rise/fall is asymmetric then we have a real error. Consequently, we can without loss of generality just model that we get an error impulse at every rising edge and the falling edge is perfect. We thus have an audioband error component being directly proportional to the transition rate. The only acceptable error is linear (DC offset and a gain error) so the transition rate should be a linear function of the audio signal. This leaves more or less a constant transition rate as the only practical solution without non-linear error. Consequently, the ISI loop filter integrates the deviation form a target (constant) transition rate. The ISI loop tries to minimize this deviation in the audio band thanks to the high audio band gain of the ISI loop filter 614 (high loop gain at low frequencies)

ISI shaping loop 610 enforces a constant average transition rate and any deviation from this constant average transition rate produces an error spectrum. The spectral components can be eliminated by using an integrator in ISI loop filter 614. ISI low pass ($H_{ILF}$) loop filter 614 takes in deviations from the desired transition rate, and amplifies the low frequency part of the deviations, since in the low frequency is where transition error is more of a problem. Each ISI loop filter 614 produces a multi-bit signed output Se that represents the transition error. When a positive error value is built up this indicates that there have not been enough transitions, that is, the transition rate for the respective segment is falling behind the desired transition rate.

TABLE 1 error vector sign correction

|  | Se[n] | Sv[n − 1] | Ss[n] | Sd[n] |
| --- | --- | --- | --- | --- |
| Too few L→H transitions | + | 0 | + | + |
| Too few L→H transitions | + | 1 | − | − |
| Too many L→H transitions | − | 0 | + | − |
| Too many L→H transitions | − | 1 | − | + |

Referring to Table 1, a positive sign at the loop filter (integrator) output, Sei[n], indicates too few L→H transitions for segment i. Conversely, a negative output indicates too many L→H transitions for segment i. Furthermore, if a segment has made too few 0→1 transitions and if its previous value is "0" then that element should be switched ON to make a 0→1 transition. If its previous value is "1" then we don't want to make a transition at all, and keep it ON. To complete the logic, if a segment has made too many 0→1 transitions and if its previous value is "0" then it should be kept OFF, so as not to incur a new 0→1 transition; however, if its previous value is "1" then it can be turned OFF. A high to low sorter in vector quantizer 602 then aligns the segments and chooses from top to bottom.

Alternatively, Table 1 could be constructed to manage H L transitions for segment i.

The function of Table 1 may be implemented by a multiplier, however, a multiplier is overkill since signal Ss is +−1. Referring again to FIG. 6, multiplier 611 combines the error signal Se and sign signal Ss from sign block 618 to from ISI error portion signal Sd 612 according to Table 1. Sign block 618 produces sign signal Ss in response to the output of adder 617 that subtracts a constant value from the previous value Sv[n−1] from register 616, according to Table 1. Each loop element of the control vector Sv has values 0 or 1. Subtracting 0.5 shifts this to +−0.5 and the sign function gives +−1. Adder 617 produces a signed value from which sign block 618 extracts just the sign.

The result is that the polarity of ISI loop output Se is flipped if the previous control state is 0 and keeps the polarity if the state is 1. In another embodiment, this can be done by controlling the add/sub input of ALU 625 in response to the previous state.

Thus, functional logic 611, 618, 617 is coupled to the ISI loop filter, such that the ISI portion of the vectorized error signal is a function of the vectorized ISI loop filter output and the control vector. In this embodiment, the functional logic is configured to subtract a constant value from the control vector and to multiply the result by the ISI loop filter output, whereby the transition rate of each bit in the control vector is increased if the loop filter output has seen too few transitions and the transition rate is decreased when there have been too many transitions.

This is actually similar to the static mismatch shaping, however instead of usage history, switching history is extracted and then weighted together with the static mismatch loop. Different weightings of the two loops may be selected to change the balance between ISI and static mismatch shaping.

Stability of the ISI loop filter could be a concern. In order to guarantee stability, a limit detector may used. When the output signal goes out of bounds it is reset back to zero. This is because the transition rate inevitably needs to go to zero at full scale when all segments are turned on (or off) at all times. Therefore, above a certain amplitude point, the desired transition rate is physically impossible and the ISI loop filter 614 may integrate off-scale. In this case, the ISI loop contribution near full scale should be ignored and the filter reset. Setting a lower desired transition rate Rtran may help by increasing the max usable amplitude or modulation index; however, doing this also compromises the shaping performance.

A problem is that any SDM will tend to have highest transition rate near midscale. At the higher end or lower end of the amplitude more segments are on or off which drives down the transition rate. That causes a fundamental modulation of transition density that is a very strong source for harmonic distortion. A target transition rate may be selected that addresses the harmonic distortion. The target transition rate is controlled by constant value $R_{TRANS}$ that is provided to adder 619. So, the fixed transition rate is selected to target eliminating distortion and the ISI shaping loop shapes AC variations around the fixed transition rate. Thus, each ISI loop filter 614 integrates a deviation from a desired transition rate by subtracting a desired transition rate number from an input of the ISI loop filter There is a 1:1 correspondence between transition rate and modulation e.g., if signal range is 0-1 and a transition rate of ¼, then every fourth symbol must be 0, for example: 1110. This transition rate would give a max value of ¾, which is only 50% of full scale, since the idle point is ½. For a transition rate of ⅛: 1111110, the max output value would be ⅞

Choosing the appropriate transition rate is tricky. Ideally the same transition rate as a PWM (pulse width modulated) system is achieved. Depending on the loop order, and whether the system is optimized for low or high signal swing, this value can be fine tuned. In one embodiment of a 1st order ISI loop, it is set to 3/16.

Figure 7:
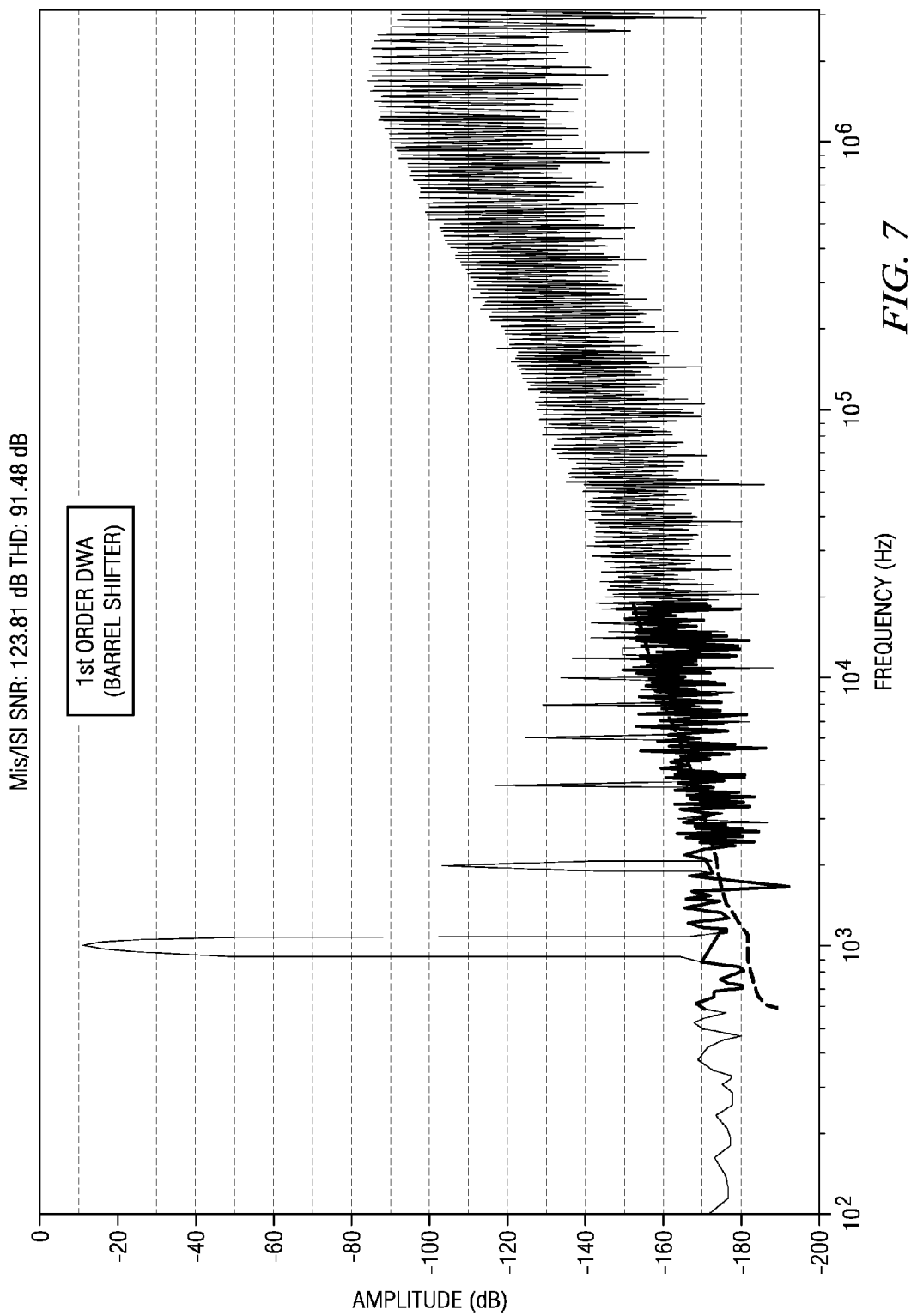
FIGS. 7-9 are plots of SNR and THD that illustrate improved performance with an inter-symbol interference shaping loop to mitigate dynamic error.
Figure 8:
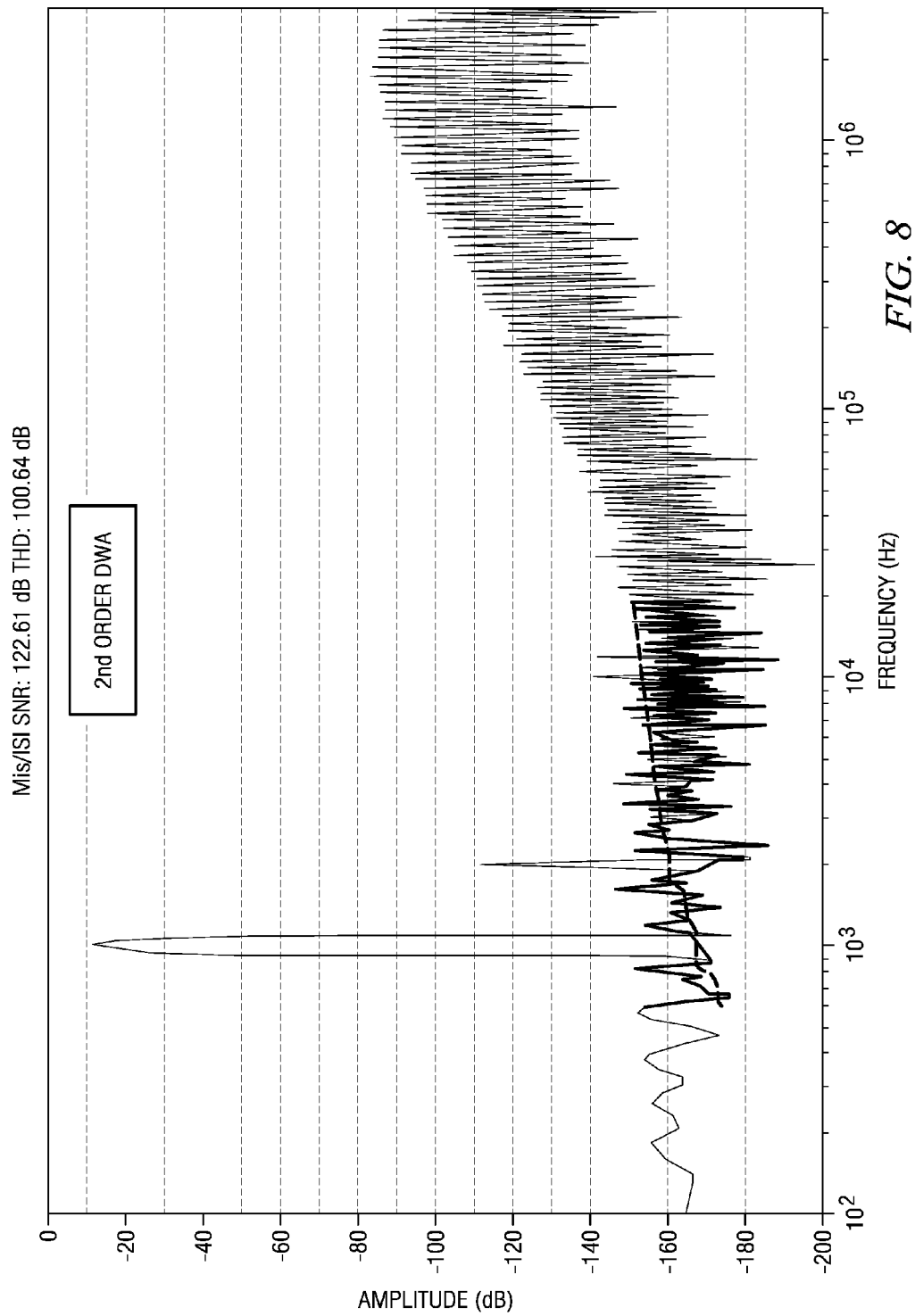
Figure 9:
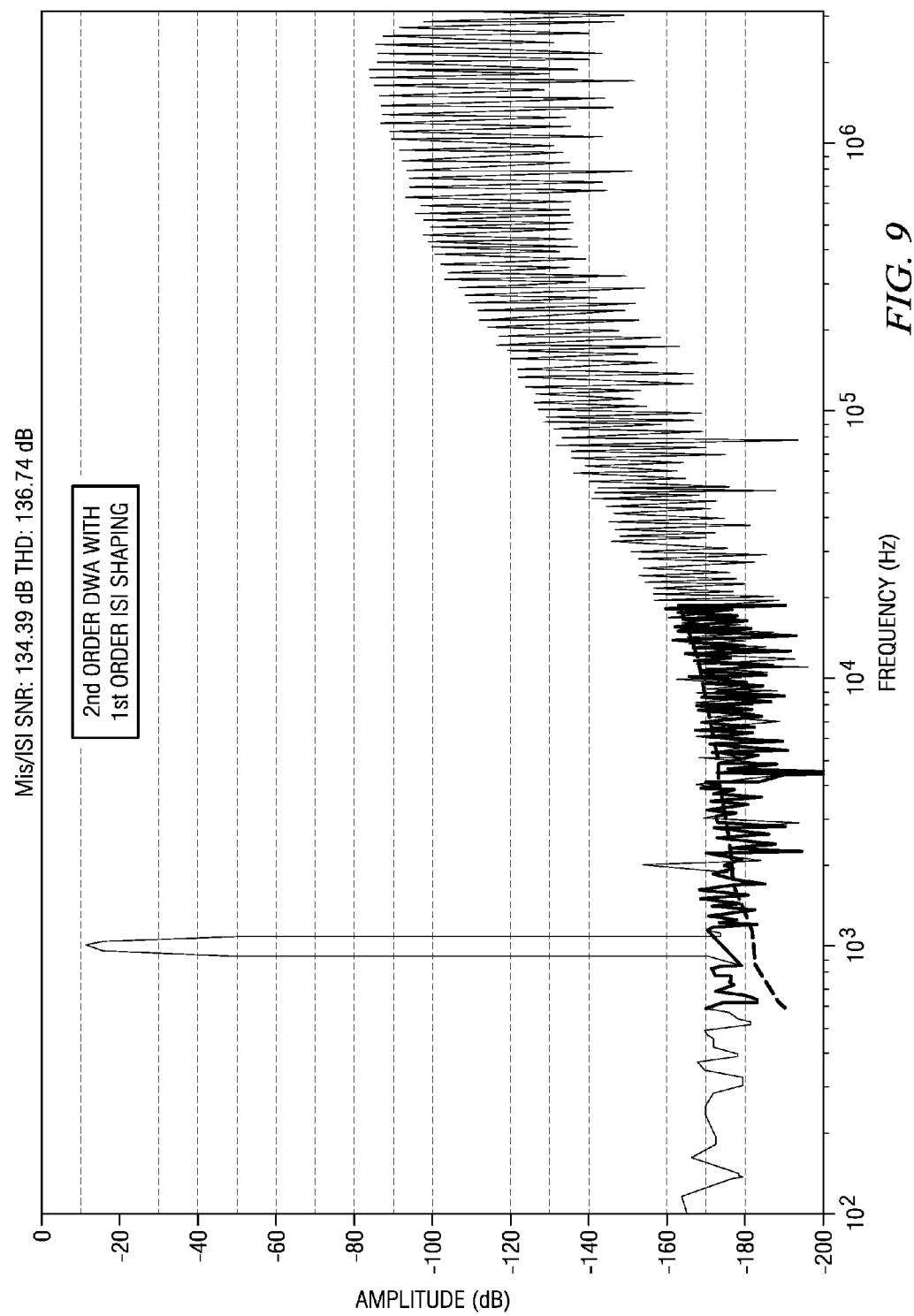

FIGS. 7-9 are simulation plots of SNR and THD that illustrate improved performance of a signal converter with an inter-symbol interference shaping loop to mitigate dynamic error. Simulations include 1% static mismatch with 20 ps rise/fall time difference to inject ISI errors. The input signal is a −12 dB 1 kHz sine wave.

Figure 2:
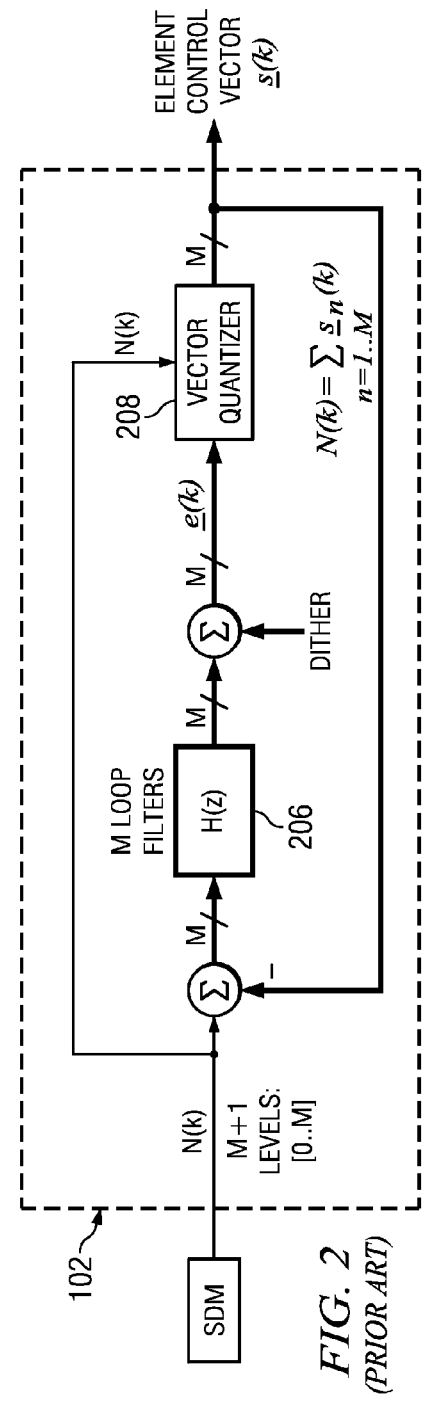
FIG. 2 is a prior art mismatch shaping module.

FIG. 7 is a simulation of a signal converter similar to FIG. 2 with first order DWA using a simple barrel shifter. SNR is 123.81 dB, THD is 91.48 dB. FIG. 8 is a simulation of a signal converter similar to FIG. 2 with second order DWA. SNR is 122.61 dB, THD is 100.64 dB. SNR for $1^{st}$ and $2^{nd}$ order DWA are about the same, however THD of $2^{nd}$ order is better.

FIG. 9 is a simulation of a signal converter similar to FIG. 6 with second order DWA and first order ISI shaping. SNR is 134.39 dB, THD is 136.74 dB. A clear improvement in the spectrum ISI shaping is apparent. Even only $1^{st}$ order ISI shaping clearly removes distortion down by 40 dB. It also improves SNR by 12 dB As an illustration of the benefit of ISI shaping, assume a target for a system being designed is to measure 114 dB THD. What is the budget for the design/layout to hit the target? If only 1st order DWA is used, it can not tolerate more than a 2% element mismatch. Even with 0% element mismatch, rise/fall time errors have to be limited to 15 ps. With 1% mismatch, it has to stay below 10 ps. If only R2DWA is used, it does really good static element mismatch shaping, but rise/fall time errors are limited to 15 ps. However, when R2DWA+ISI Shaping is used, static mismatch shaping is not compromised. It can still tolerate more than 10% errors. In addition it is remarkably resilient to dynamic errors. Rise/fall time errors up to 145 ps are now ok.

Galton Tree Embodiment

In signal converter 600 of FIG. 6, the vector quantizer VQ is implemented as a sort and then select algorithm. Implementation cost of a sort algorithm depends logarithmically to vector length, or more correctly MlogM] in this case the DAC size. For large DACs (>16 segments) digital cost will start to become a significant in terms of area and power. Equation (2) provides an estimate of the number of k-gates as a function of number of DAC elements. B is the internal register bit-size needed to compute mismatch shaping loop filter and the sorting algorithm for the vector quantizer.

$$\text{No of Gates} = \underbrace{6 \cdot B \cdot M \cdot \log_2 M}_{\substack{\text{No of gates} \\ \text{due to sorting algorithm}}} + \underbrace{5 \cdot M \cdot B \cdot 6}_{\substack{\text{No of memory gates} \\ \text{due to internal registers}}} \quad (2)$$

MlogM growth is a result of the sorting (VQ) algorithm. By using the vector normalization using minimum subtraction internal bit size can be kept close to 6-8. For a high precision DAC with M=32→64 typical gate count can be estimated to be 13→20k for M=32 and 30→45k for M=64 which is not insignificant even in a dense CMOS process.

In order to reduce the size of a high precision DAC, an embodiment of the invention may be implemented in a Galton-tree form. In an exemplary embodiment, Galton switching (S) nodes can be $1^{st}$ or $2^{nd}$ order shaping and dithered. Adding dither to the first 2-stages is typically enough to remove tonal content. In one embodiment, branching stops at Layer-2 and last layer now implements higher order ISI shaping for sub-DACs. Implementing ISI shaping for just the last layer DAC segments improves dynamic range (DR) significantly. This scheme both improves both THD and DR thanks to the ISI shaping.

Figure 10:
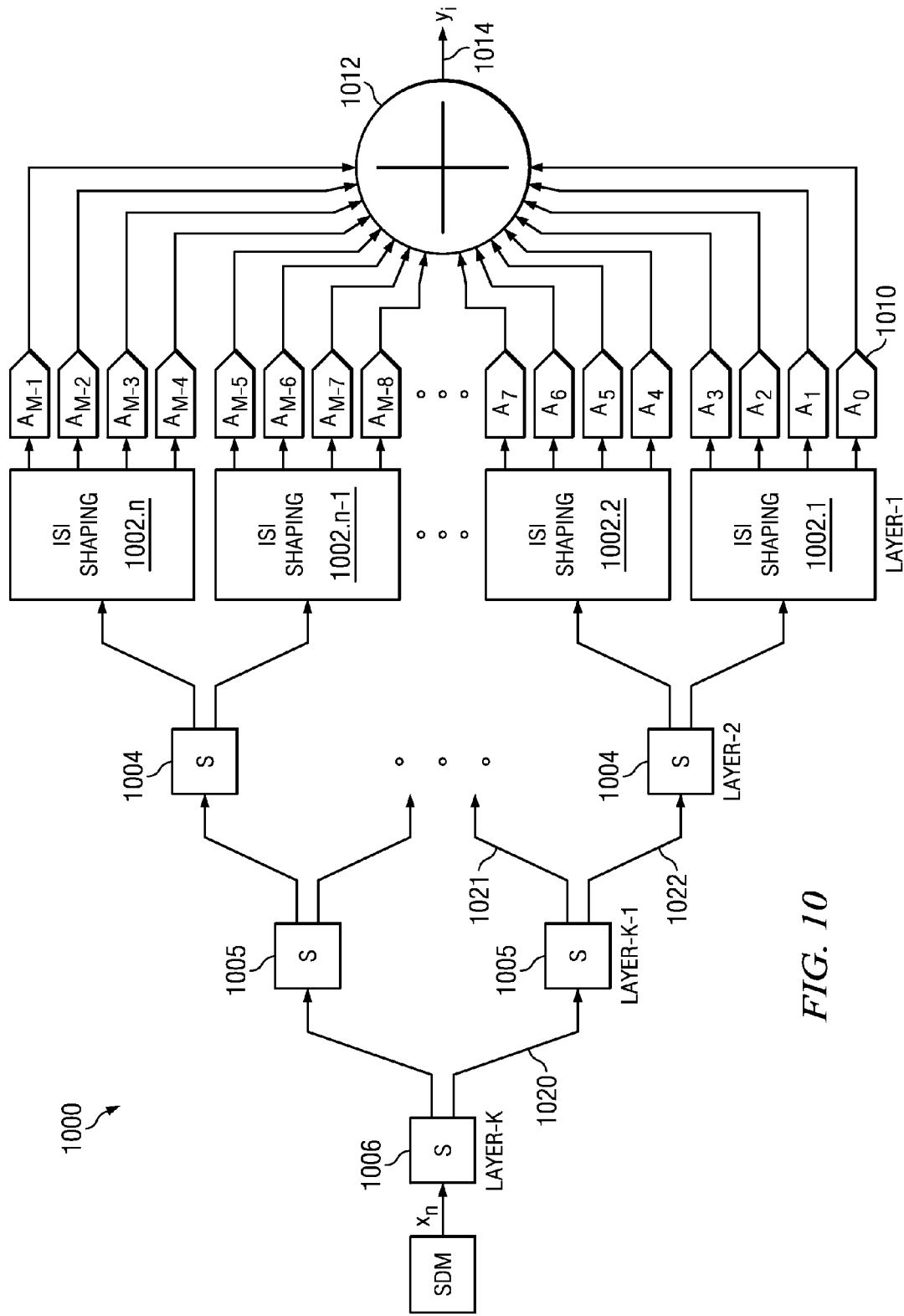
FIG. 10 is a block diagram of another embodiment of a signal converter that uses an inter-symbol interference shaping loop to mitigate dynamic error.

FIG. 10 is a block diagram of a Galton-tree embodiment of a signal converter 1000 that uses an inter-symbol interference shaping loop to mitigate dynamic error. This embodiment of the invention is a tree of nodes organized in hierarchal layers, layer-1-layer-k. Each node of a portion of the nodes, for example nodes 1004, 1005, 1006, is a branching node that has an input and two output branches, with each output branch connected to an input of a node in a lower layer, each node configured to distribute symbols received on the input across the two output branches.

The bottom layer is implemented with another portion of nodes (1002.1-1002.*n*) that are each similar to signal converter 600 of FIG. 6. Each node (1002.1-1002.*n*) includes a quantizer with a feedback loop configured to generate a control signal responsive to a stream of symbols received from the node in the next higher layer and to an error signal, and an inter-symbol-interference (ISI) shaping loop coupled to receive the control signal and to produce an ISI portion of the error signal that is responsive to inter-symbol transition rate.

Each ISI node (1002.1-1002.*n*) has its respective control vector signal connected to control a respective portion of unit segments 1010. The outputs of all of the unit segments 1010 is summed 1012 to form analog output signal 1014 that is representative of the digital input signal. In this embodiment, each ISI node is connected to four DAC segments 1010. Thus, the distribution in this portion of the nodes is responsive to the control signal of a respective one of the error shaping loops.

In this embodiment, the ISI nodes which contain ISI shaping loops are located only in the lowest layer of nodes. Each node (1002.1-1002.*n*) is structurally similar to FIG. 6. The complexity saving comes from breaking the DAC into smaller subsections which reduces the gate count for any part of the design that scales faster than linear, such as the VQ which scales as MlogM). However, in other embodiments the placement of branching nodes and nodes with ISI shaping loops may be varied.

Similar to signal converter 600, the ISI loop in each ISI node (1002.1-1002.*n*) includes an edge transition detector coupled to an ISI loop filter. The edge detector is configured to detect transitions in a respective bit of the control signal. Each ISI loop filter integrates a deviation from a desired transition rate by subtracting a desired transition rate number from an input of the ISI loop filter. Functional logic is coupled to the ISI loop filter, an operates to cause the ISI portion of the vectorized error signal to be a function of the vectorized ISI loop filter output and the control vector.

The Galton-tree structure combined with ISI shaping saves significantly in digital area and power. Referring again to equation 2, eight ISI nodes that each have a VQ that generates a vector control signal to control four segments require much significantly fewer gates than a single VQ that generates a vector control signal to control 32 segments.

The branching algorithms in branching nodes 1004-1006 do not factor in switching activity and make decisions based on equal usage. However, simulations have shown that even though ISI shaping is done only for the last 4-segment sub-DACs there is still huge improvement in linearity compared to conventional methods. This is because the 1002.x sub DACs all have their own ISI loop looking at the final segment controls so this scheme has full ISI shaping. A problem is that each sub DAC (1002.*n*) has less degrees of freedom in choosing segments compared to one full shaping loop. As discussed earlier, the ISI shaping runs into trouble hear full scale so for an amplitude which should work fine for a single loop (e.g. M=32) will cause trouble for some of the sub DACs since some of them may have a higher than average number of segments turned on and some will have less since the Galton tree distributes the total count on the sub DACs. For example, for a four segment sub DAC then the ISI scheme starts being problematic at the three out of four case and one out of four case. This causes the overall performance to drop at much lower amplitudes than for the full single ISI loop architecture. Typically, a slight loss of DR compared to the full force method will be obscured by other circuit noise sources and therefore will not be a problem.

Embodiment with Simplified Quantizer

As described above, ISI shaping is a new feature that can dramatically make the DAC performance insensitive to analog layout imperfections, while using known static mis-match shaping techniques. Dynamic errors can only be identified by tedious parasitic extraction, and <10 ps delay skews can make/break DAC performance without ISI shaping. One barrier for using ISI shaping in high precision DACs is the high gate count of a full sorting-based vector quantizer. A vector quantizer with lower gate complexity is especially useful for ISI shaping in typical mixed signal processes (e.g. 180 nm)

where the gate density is modest. A simplified quantizer will now be described in more detail.

Figure 11:
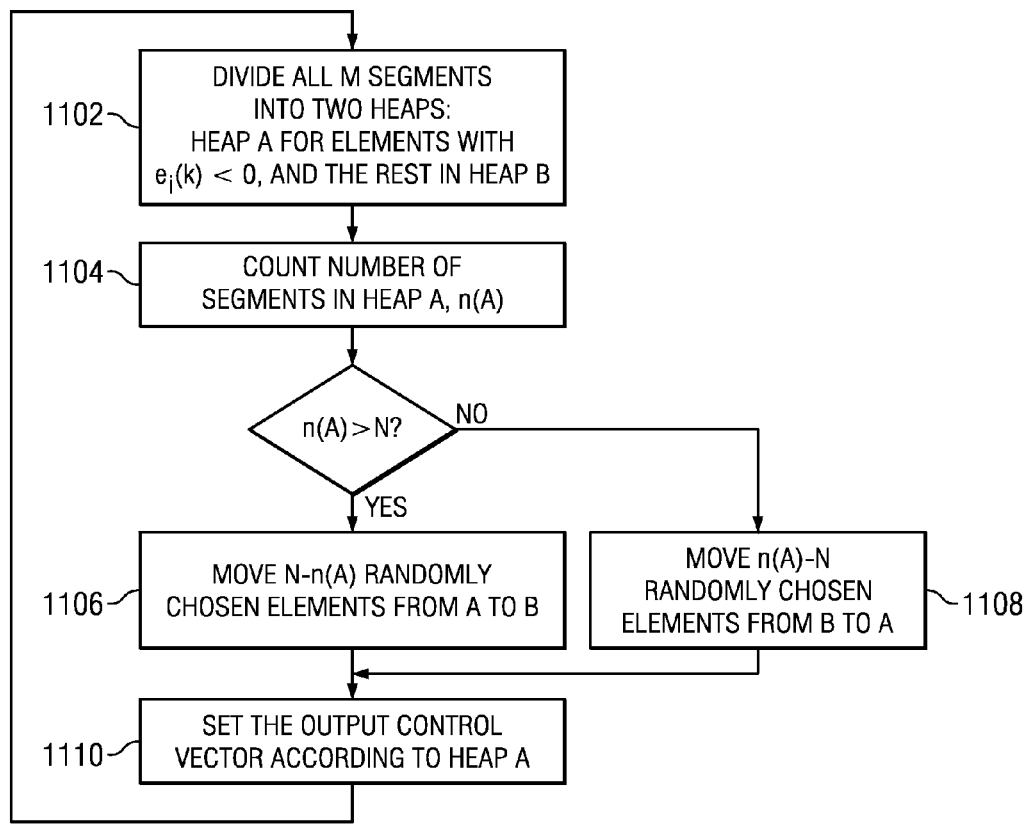
FIG. 11 is a flow diagram illustrating operation of a simplified quantizer for use in the signal converters of FIG. 6.

FIG. 11 is a flow diagram illustrating operation of a simplified quantizer for use in the signal converter of FIG. 6. The goal is to simplify the sorting of which set of N segments is to be turned on for each next clock period. In the simplest form, the segments may be divided 1102 into two heaps: heap A for all elements i with its $e_i(k)$ value above zero, the rest in the other heap B. Count 1104 the number $n_A$ elements in heap A. If $n_A$>N then move 1106 (N−$n_A$) randomly chosen elements out of heap A into heap B. If $n_A$<N then move 1108 ($n_A$−N) randomly chosen elements from heap B to heap A. Set the output control vector according to heap A that now has exactly N elements. This process is then repeated for each clock cycle.

The crude sorting (positive/negative) is essentially free since the sign bit (2's compliment) can be used. The random selection can be done with linear O(M) complexity using a selection tree. O(M) is a function that is not growing faster than linearly with M.

Figure 12:
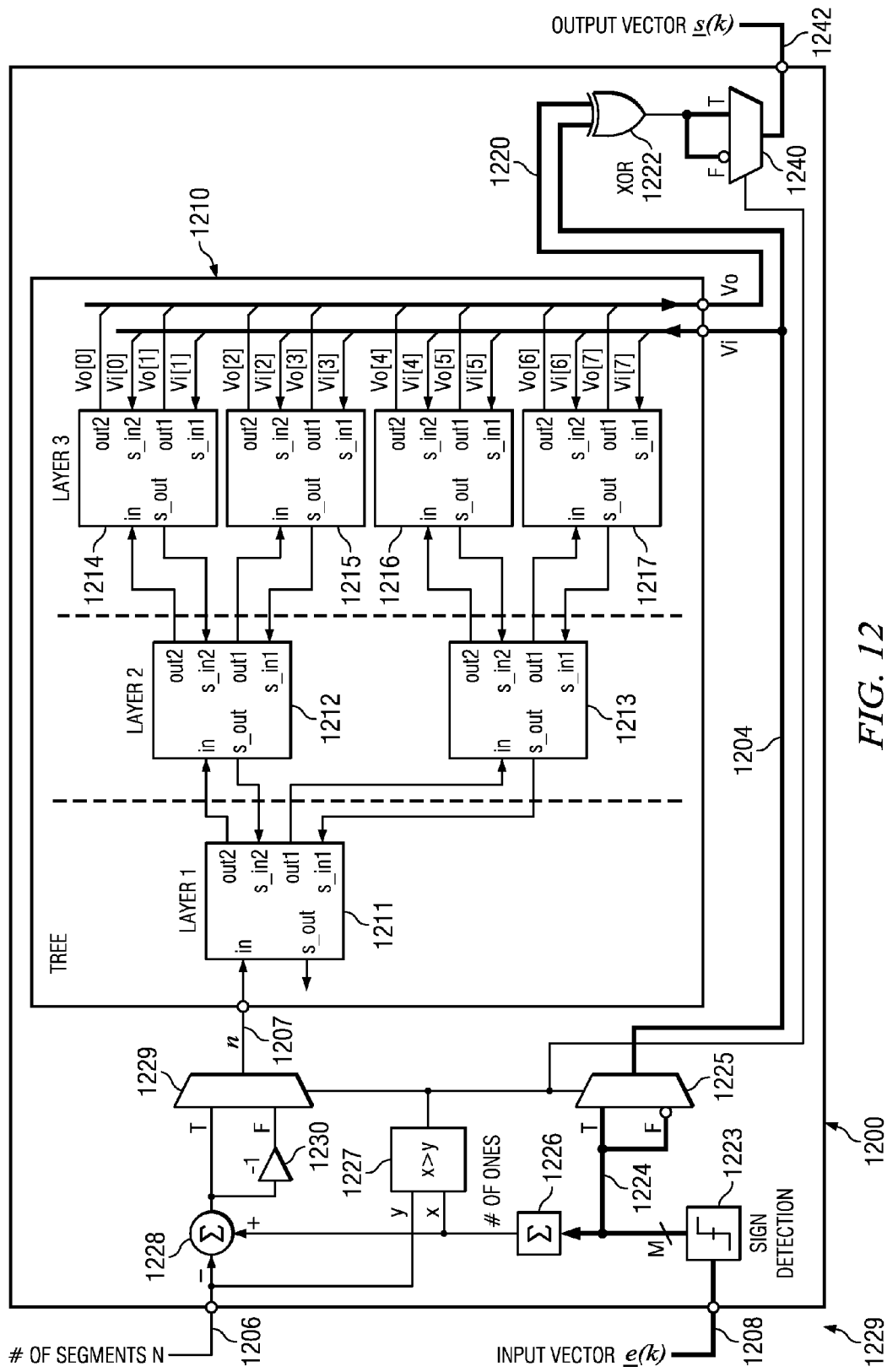
FIG. 12 is a block diagram of a simplified quantifier for use in the signal converters of FIG. 6 and FIG. 10.

FIG. 12 is a block diagram of a simplified quantifier 1200 that implements the flow of FIG. 11 for use in place of VC 600 in the signal converters of FIG. 6. A selection tree 1210 is fed by a binary {0,1} vector Vi 1204 and a number n of elements to select 1207 (where n is less or equal to the "1"'s in Vi). Vector Vi is derived from input vector e(k) 1208 which is the combined error signal provided by the static matching feedback loop and the ISI feedback loop, as described with respect to FIG. 6. Node 1210 in the top layer (layer 1) of the tree distributes the number n across two subtrees 1212, 1214 such that the sum is N. This procedure is repeated in the sub-trees forming a full tree resulting in a selection of vector Vo (binary vector) which is used to deselect elements in the input vector Vi via XOR gate 1222. Mux 1240 then passes the output of XOR gate 1222 either as-is or inverted to form vector control signal s(k) 1242 that then controls the multi-segment DAC, as described with reference to FIG. 6.

Sign detection module 112 detects the sign of each portion of the vector error signal corresponding to each element and forms a corresponding binary vector signal 1224 with a 1 representing each element whose error signal is negative, that is $e_i(k)$<0. Note that this binary vector now represents heap A, as discussed with regard to FIG. 11. This binary vector signal is then passed by mux 1225 either as-is when the mux control signal is true or inverted when the control signal is false to form vector Vi 1204. Muxes 1225, 1229 and 1240 are all controlled by a mux control signal generated by comparator 1227. Summation unit 1226 produces a number that indicates the number of bits in vector 1224 that have a value of 1. Comparator 1227 compares this number with the number N of elements signal 1206 which is received from the SDM, as described with respect to FIG. 6 or from the previous branching node as described with respect to FIG. 10. When the number of one-bits in vector 1224 is greater than the number N of elements to select, then the mux control signal for each of muxes 1225, 1229 and 1240 is "true," otherwise it is "false." Mux 1240 produces vector control signal 1242 that controls the multi-segment DAC. When the mux control signal is true, mux 1240 passes the output of XOR gate 1222 as-is, otherwise it inverts it. Summation unit 1228 subtracts the number of segments N 1206 from the number of ones signal from summation unit 1226 to form an estimated number of elements to select. 2's complement unit 1230 forms the 2's complement of this value, which is its negative value. Mux 1229 produces the number of elements n to select 1207 by selecting the number output by summation unit 1228 when the mux control signal is true or by selecting the number output by subtraction unit 1230 when the mux control signal is false.

Referring again to FIG. 11, each element for which error vector $e_i(k)$<0 represents heap A and the output of summing unit 1226 is the number of elements in heap A, n(A). Heap B is all of the other segments that are not in heap A. For the case where n(A)>N is detected by comparator 1227, N−n(A) elements are to be chosen randomly and moved into heap A. The number n output from mux 1207 represents this number. In the case where n(A)<N is detected by comparator 1227, n(A)−N elements are to be chosen randomly and moved into heap A. This case is handled by inverting the input vector to the tree via mux 1225, setting n=N−n(A) by selecting 2's complement unit 1230 with mux 1229 plus inverting the final control vector s(k) via mux 1240. Selection tree 1210 then randomly selects the segments to move between heap A and heap B based on the number n.

Referring again to selection tree 1210, the distribution into the subtrees is constrained so that the distribution never distributes more selections into a subtree than there are "1"'s in input vector Vi associated with the subtree. The tree has two opposite data flows: 1) distribution of n from trunk to the leaves that forms output selection vector Vo; 2) Counting of 1's from the leaves responsive to input vector Vi to the trunk.

Figure 13:
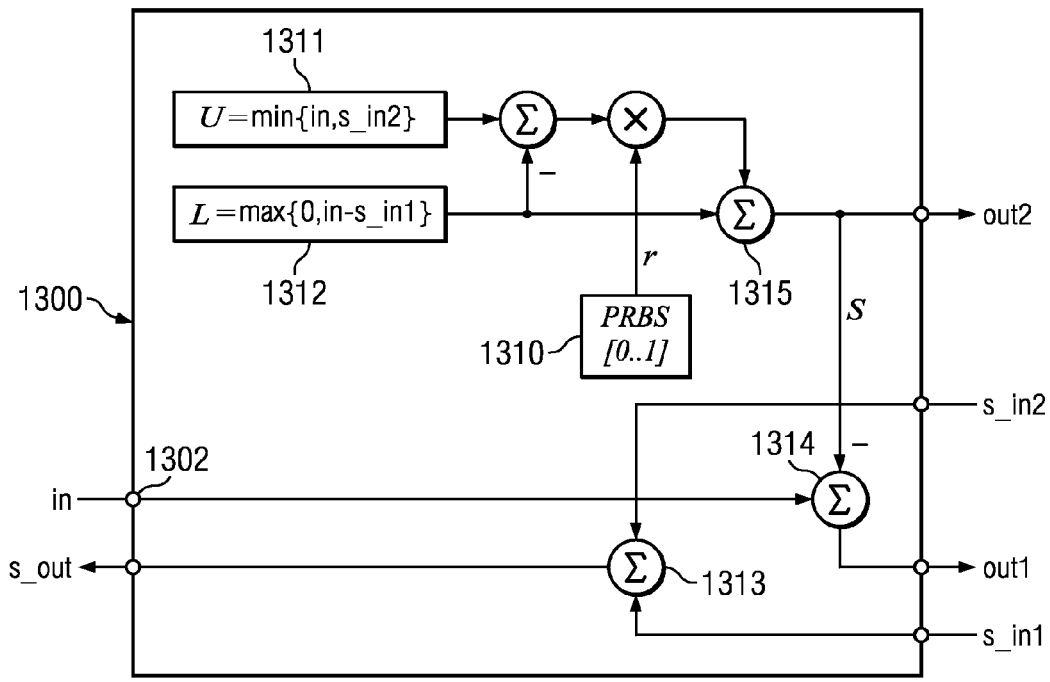
FIG. 13 is block diagram of a branching node for the quantifier of FIG. 12.

FIG. 13 is block diagram of a branching node 1300 for selection tree 1210. In one embodiment of the invention, all branch nodes 1211-1217 use the same element. This is a very simple node that performs the two data flows just described. For counting '1's in the subtrees, adder 1313 forms S_out=s_in1+s_in2.

The input 'in' on port 1302 is the number of elements to be selected by each node and is distributed randomly between the two outputs 'out1' and 'out2' using the integer variable 's': out2=s; out1=in−s. Note that out1+out2=in. A further constraint is that the outputs must not be negative and that there is not assigned more '1's than there are available "1's in the subtree below: out1<=s_in1; out2<=s_in2. This restricts the distribution variable s to be in the interval from [L . . . U], where: L=max{0, in−s_in1}; U=min{in, s_in2}. Function 1311 determines upper value U and function 1312 determines lower value L. Random generator 1310 determines a random value between 0-1 that is then multiplied by the difference between values U and L. Sum function 1315 then adds the lower value L to this result and selects the integer value to form the variable s that is out_2. Subtractor 1314 then forms out1=in−s.

Figure 14:
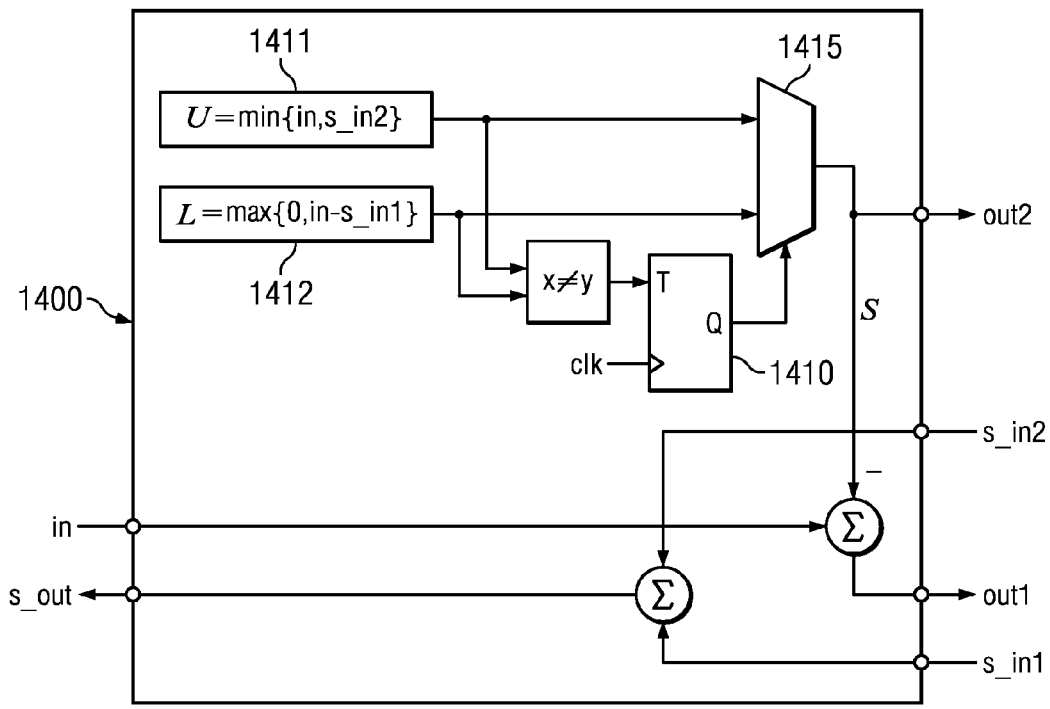
FIG. 14 is block diagram of a simplified branching node for the quantifier of FIG. 12.

FIG. 14 is block diagram of a simplified branching node 1400 for selection tree 1200. Including an individual random generator 1310 in each node requires a significant amount of gates since there are M−1 nodes. For the higher layers, the distribution span of 's' (i.e. U-L) is often only 0 or 1, so a full randomization is overkill. For these higher layers, simplified branch element 1400 may be used. Node 1400 is similar to node 1300, except random generator 1310 has been replaced with a one-bit register 1410. Register 1410 selects 's' as either L or U via mux 1415. If U is not equal to L, indicating a non-zero span, then the 1-bit register is toggled so that an opposite selection is done at next sample. This secures an even distribution over time. The state memories in multiple nodes help randomize the overall switching pattern.

In another embodiment, the same PRBS may be used and just use time shifted outputs to the different branching nodes in order to save hardware. Another option that works well in simulations is to restrict the PRBS signal to just a single bit selecting either the U or L value—this also saves hardware since fewer random and uncorrelated bits are needed.

Branch node complexity may thus be managed by using nodes 1400 in the highest layer and node 1300 for the lower layers. The highest layer has the most (i.e. M/2) nodes, however, the number range is only 0 . . . 2 for all variables (and only 0 . . . 1 for the out1 and out2 variables), i.e. less than 2 bits data width. Arithmetic '+' and '−' gets very simple. Don't cares are allowed in Boolean functions (e.g. 2 bit inputs but the input data range is only 0 . . . 2). Max 1412 and min 1411 can be implemented as a compare controlling a 2:1 mux. The compare is a Boolean function of 2×2 inputs, i.e. a truth table with 16 entries where only care about the nine entries are of interest. The lower layers using node 1300 need wider data paths (more regular adders), however, there are much fewer nodes.

In summary, a full-sorting VQ DEM needs dithering to kill tones. In principle M independent random generator signals, one for each segment. Conversely, sign-bit VQ 1200 provides randomization and simulations show that no further dither is needed in most cases. Using the simpler nodes 1400 for all but the lowest two layers results in only needing three independent random generator outputs. This is much simpler than the full-sorting VQ with independent dither on all segments.

For comparison, sign-bit based vector quantizer 1200 can be viewed as a full sorting VQ where a certain dither vector has been added to the vector input. This dither vector shifts the inputs so that the sorting VQ produces essentially the same element selection as the sign-bit based VC. Such dither will be suppressed in the audio band by the mismatch loop filter around the VQ. A typical mismatch shaper loop will need a dither vector anyway to combat spurious tones. In most cases, dither does not need to be added in the sign bit VQ scheme due to its own random selection. The result is that the sign-bit based VQ has remarkably good performance compared to a properly dithered conventional sorting-based VQ.

However, the scheme works best near mid-scale where the distribution of the input vector is symmetrical around the 0 cut line. Heap A count n(A) will match the needed N~M/2 best, i.e. the least random selections needed giving the lowest error compared to full sorting VQ. Performance drops near full scale where almost all or almost none of the elements are selected. Adjusting the cut-line separating heap A and B dynamically in response to the signal level may get a better general matching of the heap A count compared to the needed N elements to reduce the number of random selections.

There is a dramatic gate count reduction for implementing the sign bit VG 1200 as compared to the full sorting VG. For example, for M=32: the gate count drops from ~15k down to ~1k.

In another embodiment of a sign bit quantizer, more cut lines are provided so that the segments are divided into more than just two heaps. This reduces the error compared to the full sorting VQ by reducing the amount of random selection needed; however, this also drives up the complexity. Three cut lines dividing into four heaps is a good compromise with modest complexity and improved performance near full scale.

In another embodiment of a signal converter, the sign bit quantizer may be used in a signal converter without the ISI shaping loop.

Another Galton Tree Embodiment

Figure 15:
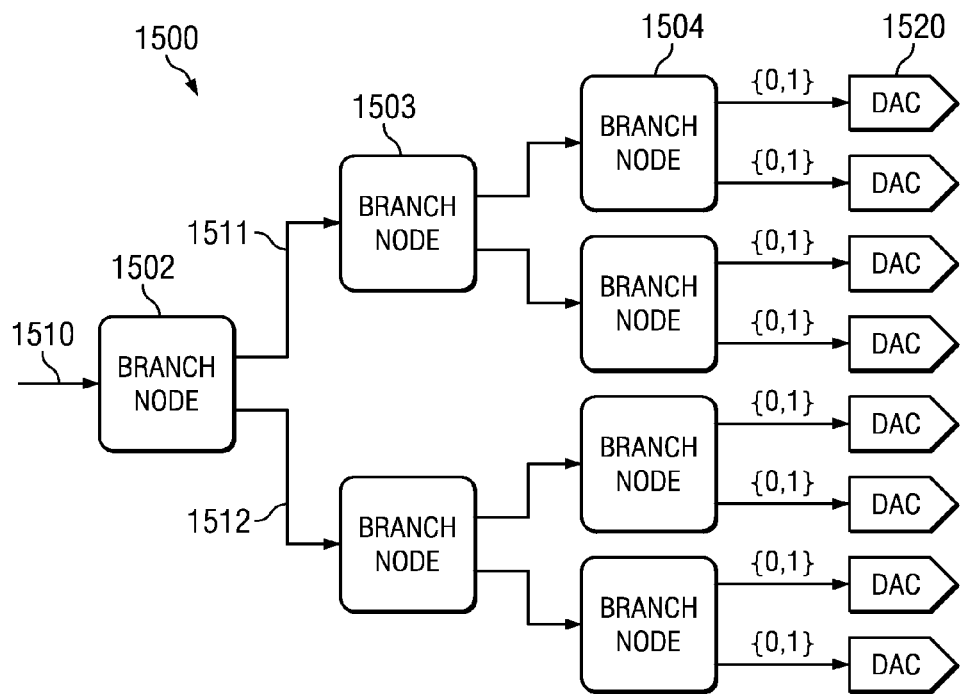
FIG. 15 is a block diagram of a Galton tree data converter that incorporates an inter-symbol interference shaping loop in each branching node.

FIG. 15 is a block diagram of a Galton tree data converter 1500 that incorporates an inter-symbol interference shaping loop in each branching node. As described earlier with respect to FIG. 10, a Galton tree includes a number of hierarchical layers, indicated at 1502, 1503 and 1504 in exemplary Galton tree 1500. Other embodiments may have more, or fewer, layers. Each branch node has an input, such as input 1510 of node 1502 and two outputs 1511, 1512, with each output branch connected to an input of a node in a lower layer. Each node is configured to distribute symbols received on the input across the two output branches. The outputs of the bottom layer are then connected to unit DACs 1520 whose outputs are then summed to form an analog output signal representative of an input stream of digital samples.

Figure 16:
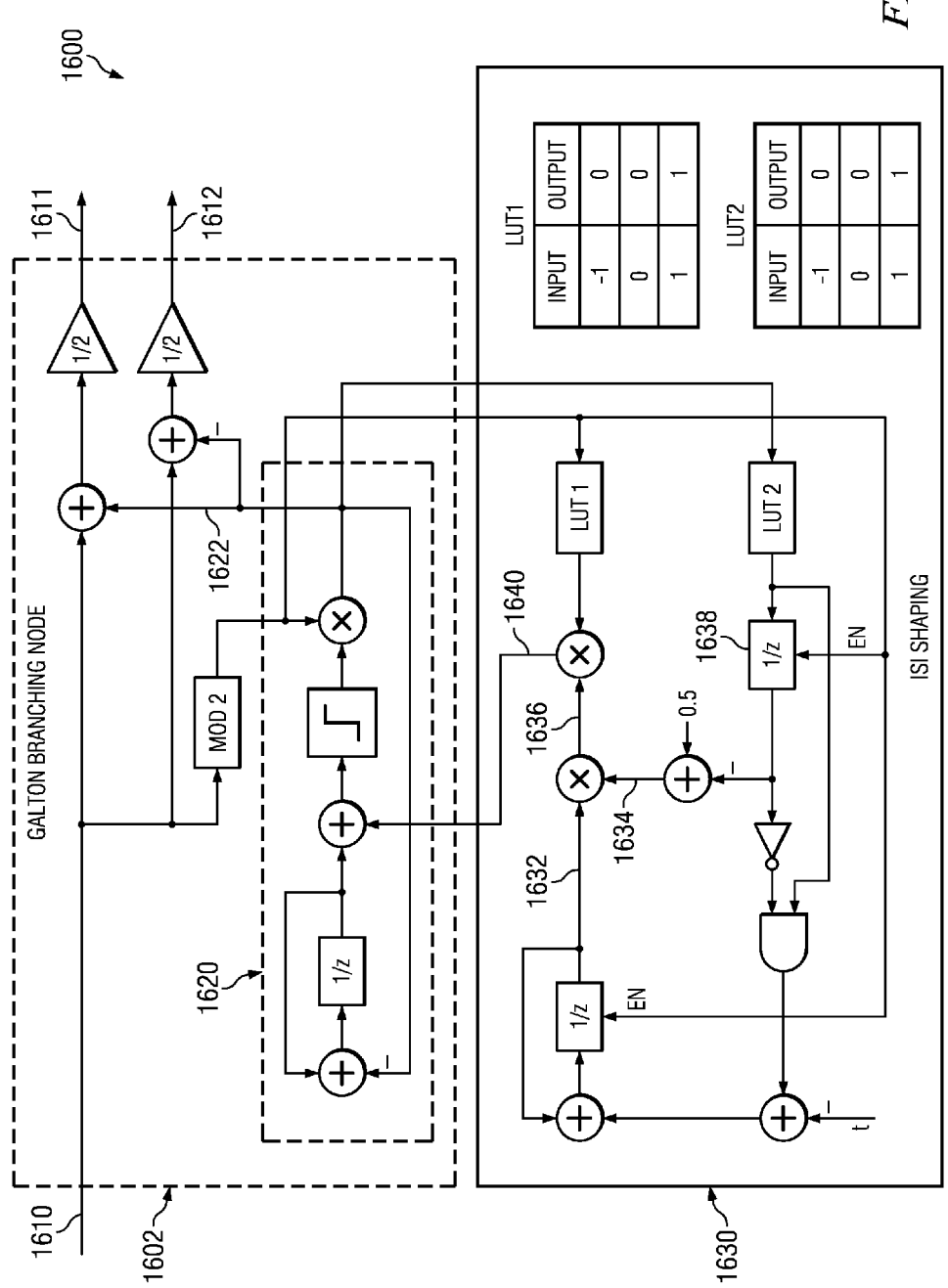
FIG. 16 is a more detailed block diagram of each node of the Galton tree of FIG. 15.

In this embodiment, all of the branching nodes contain ISI shaping loops, which are illustrated in more detail in FIG. 16. As mentioned above, each branching node 1600 has an input 1610 and two outputs 1611, 1612, with each output branch connected to an input of a node in a lower layer. Each node has a branching node 1602 that is configured to distribute symbols received on the input across the two output branches. Branching node 1602 has a simple quantizer with a feedback loop 1620 that functions as a Sigma-Delta Modulator that forms a control signal 1622 that is combined with input signal 1610 to form output signals 1611, 1612. In this embodiment there are just two quantization levels, however, other embodiments may use more than two quantization levels. Feedback loop 1620 makes decisions based on equal usage.

Inter-symbol-interference (ISI) shaping loop 1630 is coupled to receive control signal 1622 to produce an ISI portion of the error signal that is responsive to inter-symbol transition rate. ISI shaping loop operates in a similar manner to ISI shaping loop 610 in FIG. 6, except lookup table LUT2 is a combinatorial function that converts the $\{-1,0,1\}$ input signal into a $\{0,1\}$ signal where '0' maps into '0. Edge detection is done by the delay element 1638 and the AND gate, as described with regard to FIG. 6. A multiplier combines the error signal 1632 and sign signal 1634 to form ISI error signal 1636. Sign signal 1634 is produced in response to the output of an adder that subtracts a constant value from the previous value from register 1638, according to LUT2. Each LUT2 output has values 0 or 1. Subtracting 0.5 shifts this to +−0.5 and the sign function gives +−1. The adder produces a signed value from which the sign is extracted. In this embodiment, the functional logic is configured to subtract a constant transition value (t) from the control signal in each branching node and to multiply the result by the ISI loop filter output, whereby the transition rate of output signal 1611, 1612 is increased if the loop filter output has seen too few transitions and the transition rate is decreased when there have been too many transitions.

LUT1 provides a further modification that is applied to error signal 1636 to form ISI error portion signal 1640 that is then coupled to feedback loop 1620. The modulo 2 (MOD2) function operating on the node input signal 1610 is zero when the input is even. In this case the output of sigma-delta loop 1620 is forced to zero and the branching node will therefore distribute the input evenly on the two outputs 1611 and 1612. In this case, the ISI-portion of the error signal is disregarded, hence the LUT1 and multiplier producing signal 1640 which represents the ISI portion coupled to the quantizer input is ignored. The LUT2 also has the effect that the state is ignored when the input is even and the 1620 loop output is zero. Simulations show the values shown for LUT1 and LUT2 work well in this configuration. In other embodiments with different configurations, such as with additional quantization levels, the values of LUT1 and/or LUT2 may be varied.

Figure 17:
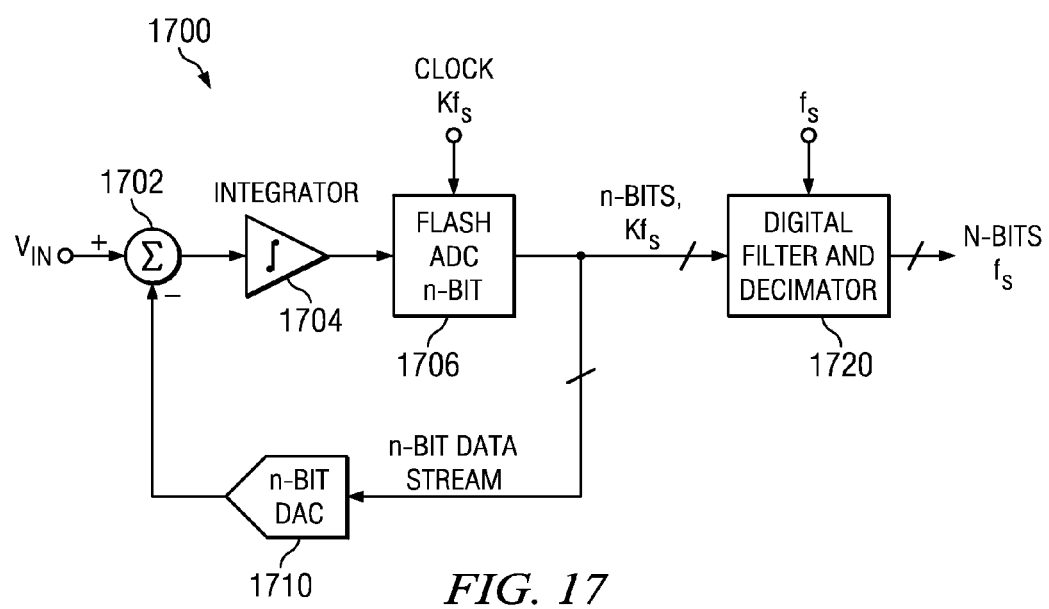
FIG. 17 is a block diagram of a signal converter that performs analog to digital conversion.

FIG. 17 is a block diagram of a signal converter that performs analog to digital conversion using an embodiment of the present invention. An analog signal is applied to the input of summing node 1702. Integrator 1704 integrates the output of the summing node and flash analog to digital converter 1706 converts the output of integrator 1704 to an n-bit digital value. The flash converter is clocked at a rate that is K times the desired digital output rate.

This n-bit data stream is then applied to n-bit DAC 1710 which is embodied as a data converter as described herein. In particular, it includes a quantizer with a feedback loop configured to generate a control signal responsive to the stream of n-bit data values and to an error signal, and an inter-symbol-interference (ISI) shaping loop coupled to receive the control signal and to produce an ISI portion of the error signal that is responsive to inter-symbol transition rate. The control signal is coupled to a multi-segment DAC that produces an analog output signal by summing the outputs of each of the multiple segments that is an analog representation of the stream of n-bit data values. The analog output signal of DAC 1710 is then provided to summer 1702 as an error signal. DAC 1710 may be implemented as described with respect to FIG. 6, 10, 12, or 15, for example.

The n-bit data stream produced by flash ADC 1706 is filtered and decimated by digital filter and decimator 1720 to produce the final digital output stream that has a higher precision but a lower frequency than the output of flash ADC 1706.

System Example

Figure 18:
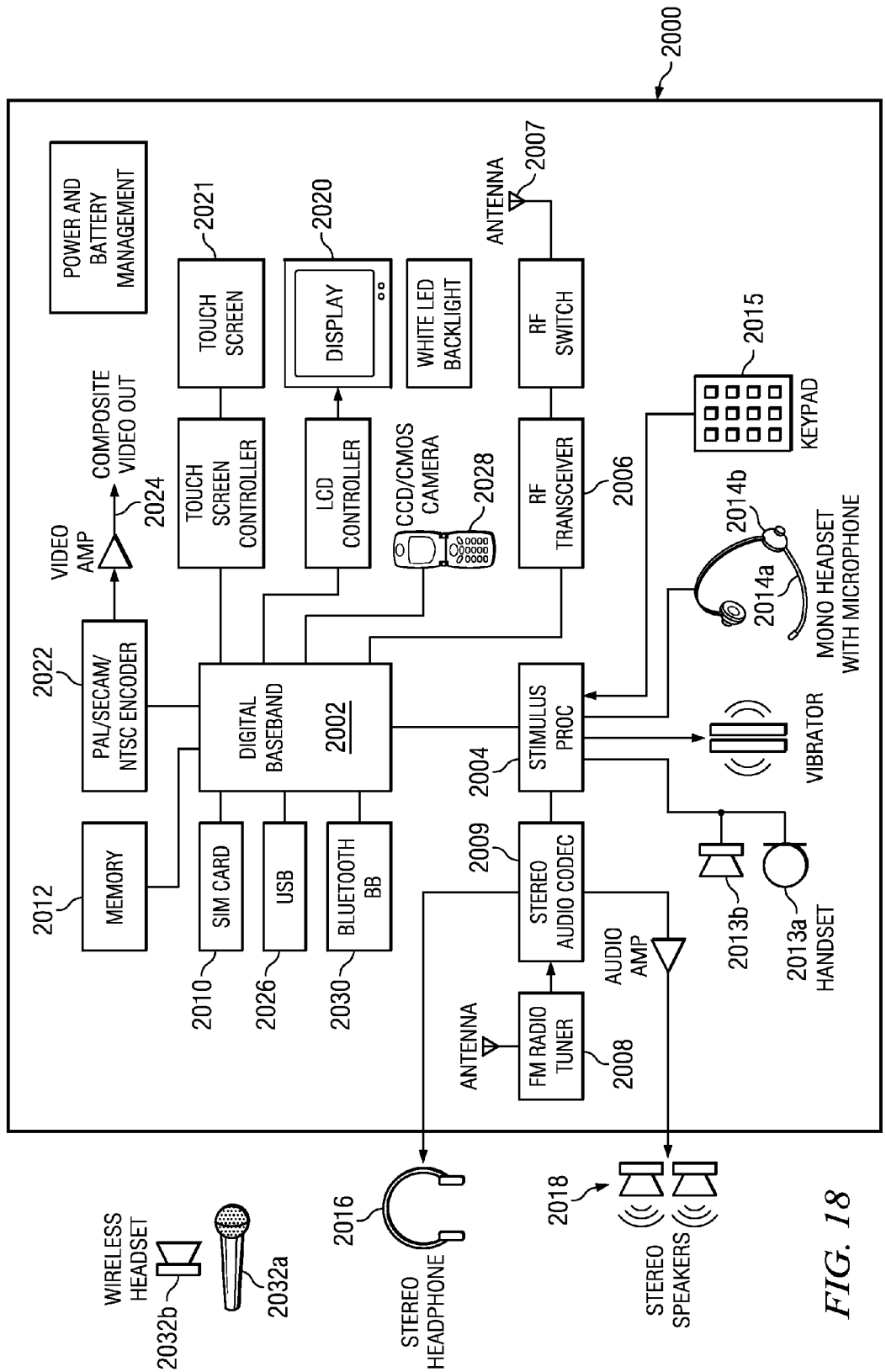
FIG. 18 is a block diagram of a mobile device that uses the signal converter of FIG. 6, FIG. 10, FIG. 12 or FIG. 15.

FIG. 18 is a block diagram of mobile cellular phone 2000 for use in a cellular network. Digital baseband (DBB) unit 2002 can include a digital processing processor system (DSP) that includes embedded memory and security features. Stimulus Processing (SP) unit 2004 receives a voice data stream from handset microphone 2013a and sends a voice data stream to handset mono speaker 2013b. SP unit 2004 also receives a voice data stream from microphone 2014a and sends a voice data stream to mono headset 2014b. Usually, SP and DBB are separate ICs. In most embodiments, SP performs processing based on configuration of audio paths, filters, gains, etc being setup by software running on the DBB. In an alternate embodiment, SP processing is performed on the same processor that performs DBB processing. In another embodiment, a separate DSP or other type of processor performs SP processing.

SP unit 2004 may include a digital to analog converter as described in more detail with respect to FIG. 6, 10 12, or 15 for generating audio signals for headset 2014b and speaker 2013b from digital signals processed by DBB from radio signals received by RF transceiver 2006. In particular, it includes a quantizer with a feedback loop configured to generate a control signal responsive to the stream of n-bit data values from DBB 1002 and to an error signal, and an inter-symbol-interference (ISI) shaping loop coupled to receive the control signal and to produce an ISI portion of the error signal that is responsive to inter-symbol transition rate. The control signal is coupled to a multi-segment DAC that produces an analog output signal by summing the outputs of each of the multiple segments that is an analog representation of the stream of n-bit data values.

SP unit 2004 may also includes an analog to digital converter as described in more detail with respect to FIG. 17 for converting an audio analog signal from microphone 2014a and 2013a to a digital signal that is then processed by DBB unit 1002 for transmission via RF transceiver 2006.

RF transceiver 1106 is a digital radio processor and includes a receiver for receiving a stream of coded data frames from a cellular base station via antenna 1107 and a transmitter for transmitting a stream of coded data frames to the cellular base station via antenna 1107. RF transceiver 1106 is connected to DBB 1102 which provides processing of the frames of encoded data being received and transmitted by cell phone 1100.

DBB unit 2002 may send or receive data to various devices connected to universal serial bus (USB) port 2026. DBB 2002 can be connected to subscriber identity module (SIM) card 2010 and stores and retrieves information used for making calls via the cellular system. DBB 2002 can also connect to memory 2012 that augments the onboard memory and is used for various processing needs. DBB 2002 can be connected to Bluetooth baseband unit 2030 for wireless connection to a microphone 2032a and headset 2032b for sending and receiving voice data. DBB 2002 can also be connected to display 2020 and can send information to it for interaction with a user of the mobile UE 2000 during a call process. Display 2020 may also display pictures received from the network, from a local camera 2026, or from other sources such as USB 2026. DBB 2002 may also send a video stream to display 2020 that is received from various sources such as the cellular network via RF transceiver 2006 or camera 2026. DBB 2002 may also send a video stream to an external video display unit via encoder 2022 over composite output terminal 2024. Encoder unit 2022 can provide encoding according to PAL/SECAM/NTSC video standards. In some embodiments, audio codec 2009 receives an audio stream from FM Radio tuner 2008 and sends an audio stream to stereo headset 2016 and/or stereo speakers 2018. In other embodiments, there may be other sources of an audio stream, such a compact disc (CD) player, a solid state memory module, etc.

OTHER EMBODIMENTS

While the invention has been described with reference to illustrative embodiments, this description is not intended to be construed in a limiting sense. Various other embodiments of the invention will be apparent to persons skilled in the art upon reference to this description. For example, While the sign bit quantizer is described in FIG. 12 as including a switching tree, the general scheme is that the quantizer just uses the sign bits of the error vector input. The tree structure that is shown is just one embodiment. Another embodiment is more similar to a sorting scheme but just uses the sign bits, with some randomization. In one embodiment, just the sign bit is used instead of the full precision numbers of the error vector. Other embodiments include similar "crude quantization" schemes, such as using only the two most significant bits (MSB's) of the error vector. This is much simpler than the full precision sorting and better than the just sign bit sorting method.

While a mobile handset has been described, embodiments of the invention are not limited to cellular phone devices. Various personal devices such as audio players, video players, radios, televisions, personal digital assistants (PDA) may use an embodiment of the invention to produce superior analog to digital conversion.

Although the invention finds particular application to systems using Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library.

An embodiment of the invention may include a system with a processor coupled to a computer readable medium in which a software program is stored that contains instructions that when executed by the processor perform the functions of modules and circuits described herein. The computer readable medium may be memory storage such as dynamic random access memory (DRAM), static RAM (SRAM), read only memory (ROM), Programmable ROM (PROM), erasable PROM (EPROM) or other similar types of memory. The computer readable media may also be in the form of magnetic, optical, semiconductor or other types of discs or other portable memory devices that can be used to distribute the software for downloading to a system for execution by a processor. The computer readable media may also be in the form of magnetic, optical, semiconductor or other types of disc unit coupled to a system that can store the software for downloading or for direct execution by a processor.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. A signal converting system comprising a multi-segment digital to analog converter coupled to one or more error shaping loops, wherein each error shaping loop comprises:
    a quantizer with a feedback loop configured to generate a control signal responsive to a stream of symbols and to an error signal, and
    an inter-symbol-interference (ISI) shaping loop coupled to receive the control signal and to produce an ISI portion of the error signal that is responsive to inter-symbol transition rate.

2. The signal converter of claim 1, wherein the stream of symbols is a sigma delta modulated (SDM) signal, the control signal is a vectorized control signal, and the error signal is a vectorized error signal;
    wherein the quantizer is configured to generate the control vector responsive to the SDM signal and to the vectorized error signal, the control vector operable to turn each of the M unit segments on and off, wherein the quantizer is configured so that the sum of turned on elements approximately represents the SDM signal;
    wherein the feedback loop is a vectorized mismatch shaping loop coupled to receive the control vector and to produce a portion of the vectorized error signal by filtering usage history of each of the M segments to normalize the frequency of usage and spectrally shape each segment signal, and
    wherein the ISI loop is a vectorized inter-symbol-interference (ISI) shaping loop coupled to receive the control vector and to produce the ISI portion of the vectorized error signal that is responsive to inter-symbol interference.

3. The signal converter of claim 2, wherein the vectorized ISI shaping loop comprises M loops each comprising an edge transition detector coupled to an ISI loop filter, the edge detector operable to detect transitions in a respective bit of the control vector.

4. The signal converter of claim 3, wherein each ISI loop filter integrates a deviation from a desired transition rate by subtracting a desired transition rate number from an input of the ISI loop filter.

5. The signal converter of claim 3, further comprising functional logic coupled to the ISI loop filter, wherein the ISI portion of the vectorized error signal is a function of the vectorized ISI loop filter output and the control vector.

6. The signal converter of claim 5, wherein the functional logic is configured to subtract a constant value from the control vector and to multiply the result by the ISI loop filter output, whereby the transition rate of each bit in the control vector is increased if the loop filter output has seen too few transitions and the transition rate is decreased when there have been too many transitions.

7. The system of claim 2, further comprising a sigma delta modulator coupled to provide the SDM signal to the quantizer.

8. The system of claim 1, wherein the digital to analog converter (DAC) is comprised within an analog to digital converter (ADC).

9. The system of claim 1, wherein the digital to analog converter (DAC) is comprised within a mobile handset, further comprising a radio receiver coupled to the DAC to provide the stream of symbols and a speaker coupled to an output of the DAC.

10. The signal converter of claim 1, further comprising a tree of nodes organized in hierarchal layers, wherein each node of a portion of the nodes is a branching node that has an input and two output branches, with each output branch connected to an input of a node in a lower layer, each branching node configured to distribute symbols received on the input across the two output branches; and
    wherein the distribution in each of another portion of the nodes is responsive to the control signal of a respective one of the error shaping loops.

11. The signal converter of claim 10, wherein the ISI shaping loops are comprised in only the lowest layer of nodes.

12. The signal converter of claim 10, wherein each ISI loop comprises an edge transition detector coupled to an ISI loop filter, the edge detector operable to detect transitions in a respective bit of the control signal.

13. The signal converter of claim 12, wherein each ISI loop filter integrates a deviation from a desired transition rate by subtracting a desired transition rate number from an input of the ISI loop filter.

14. The signal converter of claim 13, further comprising functional logic coupled to the ISI loop filter, wherein the ISI portion of the vectorized error signal is a function of the vectorized ISI loop filter output and the control vector.

15. The signal converter of claim 1, wherein the multi-segment digital to analog converter comprises M unit segments, wherein the control signal is a vectorized control signal controllably coupled to the M unit segments to turn on N of the unit segments at a time, wherein the quantizer comprises:
    an allocation function configured to allocate the M unit segments to either a heap A when a respective segment's error signal is positive or to a heap B when the segment's error signal is negative;
    a balance function configured to transfer segments in a random manner from heap A to heap B when N is less than the number of segments in heap A, and to transfer segments in a random manner to heap A from heap B when N is greater than the number of segments in heap A; and a control function to set the control vector according to heap A.

16. The signal converter of claim 15, wherein the allocation function and the balance function comprise:

circuitry to determine a difference n between N and a current number of positive bits in the vectorized error signal;

selection circuitry configured to select in a random manner n additional segments to turn on when n is positive or n segments to turn off when n is negative.

17. The signal converter of claim 16, wherein the selection circuitry comprises a tree of similar nodes, wherein when n is negative, each node is configured to receive a number of segments that have a positive bit in the error vector that are connected to a subtree connected to the node, and wherein each node is configured to distribute to the connected subtree a de-selection amount, such that the de-selection amount is not greater than the number of positive bits in the error signal connected to the subtree.

18. The signal converter of claim 17, wherein a portion of the nodes comprise a random generator configured to select a deselection amount provided to branches of the connected subtree.

19. The signal converter of claim 18, wherein leaf nodes that can only deselect one segment comprise a flip-flop configured to select a deselection amount.

20. A method for converting data, the method comprising:

receiving a stream of symbols;

generating a control signal responsive to the stream of symbols and to an error signal;

producing an inter-symbol-interference (ISI) portion of the error signal that is responsive to inter-symbol transition rate; and controlling a multi-segment unit-element digital to analog converter comprising M unit segments with outputs summed together in response to the control signal to produce an analog signal that represents the stream of symbols.

* * * * *